(12) United States Patent
Tezuka et al.

(10) Patent No.: US 11,367,496 B2
(45) Date of Patent: Jun. 21, 2022

(54) MEMORY CIRCUIT

(71) Applicant: SONY SEMICONDUCTOR SOLUTIONS CORPORATION, Kanagawa (JP)

(72) Inventors: Hiroyuki Tezuka, Kanagawa (JP); Masami Kuroda, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 17/250,417

(22) PCT Filed: Jul. 25, 2019

(86) PCT No.: PCT/JP2019/029118
§ 371 (c)(1),
(2) Date: Jan. 19, 2021

(87) PCT Pub. No.: WO2020/026929
PCT Pub. Date: Feb. 6, 2020

(65) Prior Publication Data
US 2021/0280265 A1    Sep. 9, 2021

(30) Foreign Application Priority Data
Jul. 30, 2018    (JP) .............................. JP2018-142041

(51) Int. Cl.
*G11C 29/24* (2006.01)
*G11C 11/16* (2006.01)
(Continued)

(52) U.S. Cl.
CPC .......... *G11C 29/24* (2013.01); *G11C 11/1673* (2013.01); *G11C 13/004* (2013.01); *G11C 29/022* (2013.01); *G11C 2013/0054* (2013.01)

(58) Field of Classification Search
CPC ... G11C 29/24; G11C 11/1673; G11C 13/004; G11C 29/022; G11C 2013/0054; G11C 7/06; G11C 7/14; G11C 11/2273
See application file for complete search history.

(56) References Cited

U.S. PATENT DOCUMENTS 6,141,277 A    10/2000    Tanzawa
8,559,253 B2 *  10/2013    Kitagawa ........... G11C 13/0009
                                                   365/203
(Continued)

FOREIGN PATENT DOCUMENTS

JP    2000-090682 A    3/2000
JP    2006-286047 A    10/2006
(Continued)

OTHER PUBLICATIONS

International Search Report and Written Opinion of PCT Application No. PCT/JP2019/029118, dated Aug. 20, 2019, 09 pages of ISRWO.

*Primary Examiner* — Mohammed A Bashar
(74) *Attorney, Agent, or Firm* — Chip Law Group

(57) ABSTRACT

The reference cells used for reading out data are tested efficiently so as to improve the reliability of the readout data. A memory circuit includes multiple memory arrays, a selection circuit, and a sense amplifier. The selection circuit selects values output from memory cells in any of the multiple memory arrays so as to supply a first value and a second value. A sense amplifier has a first input terminal and a second input terminal. The sense amplifier amplifies and outputs the first value supplied to the first input terminal in reference to the second value supplied to the second input terminal.

14 Claims, 23 Drawing Sheets

(51) Int. Cl.
    *G11C 13/00*        (2006.01)
    *G11C 29/02*        (2006.01)

(56) References Cited

U.S. PATENT DOCUMENTS

| | | |
|---|---|---|
| 2007/0109841 A1 | 5/2007 | Lin et al. |
| 2012/0044755 A1 | 2/2012 | Kim et al. |
| 2012/0314478 A1* | 12/2012 | Ha .................... G11C 13/0004 |
| | | 365/148 |
| 2015/0318033 A1 | 11/2015 | Kajigaya |
| 2015/0357035 A1* | 12/2015 | Kim .................. G11C 13/0035 |
| | | 365/148 |

FOREIGN PATENT DOCUMENTS

| | | |
|---|---|---|
| JP | 2015-210837 A | 11/2015 |
| JP | 2015-219935 A | 12/2015 |
| WO | 2012/027291 A1 | 3/2012 |

* cited by examiner $vd \cong m*i0*R, \quad R \in RH, RL$

FIG. 7

| CASE | #1 | | #2 | | #3 | | #4 | |
|---|---|---|---|---|---|---|---|---|
| SENSE TARGET | R0, R2 | | R1, R3 | | D0, D1 | | D0, D1 | |
| REFERENCE POTENTIAL GENERATION | R1, R3 | | R0, R2 | | R0, R2 | | R1, R3 | |
| SELECTION CIRCUIT | ARY0 | ARY1 | ARY0 | ARY1 | ARY0 | ARY1 | ARY0 | ARY1 |
| CM0 | off | on | off | off | on | off | on | off |
| CM1 | off | off | off | on | off | on | off | off |
| CM2 | off | off | off | on | off | off | off | off |
| CM3 | off | on | off | off | off | off | off | on |
| CS0 | — | on | — | on | on | on | on | — |
| CS1 | — | off | — | off | off | off | off | — |
| CS2 | — | off | — | off | off | off | off | — |
| CS3 | — | off | — | off | off | off | off | — |
| CS4 | — | on | — | on | — | — | — | on |
| CS5 | — | off | — | off | — | — | — | off |
| CS6 | — | off | — | off | — | — | — | off |
| CS7 | — | off | — | off | — | — | — | off | on : CONDUCTING
off : INSULATED
— : ANY STATE ial Phase of International
MEMORY CIRCUIT

CROSS REFERENCE TO RELATED APPLICATIONS

This application is a U.S. National Phase of International Patent Application No. PCT/JP2019/029118 filed on Jul. 25, 2019, which claims priority benefit of Japanese Patent Application No. JP 2018-142041 filed in the Japan Patent Office on Jul. 30, 2018. Each of the above-referenced applications is hereby incorporated herein by reference in its entirety.

TECHNICAL FIELD

The present technology relates to a memory circuit. More particularly, the technology relates to a memory circuit that allows data cells to be read out with use of the values of reference cells as a reference potential.

BACKGROUND ART

There are known methods in which the sense amplifier of a memory using the magnetoresistance effect (MRAM: Magnetoresistive Random Access Memory) generates a reference potential by connecting multiple memory cells parallelly or serially with one another for use as a reference resistance for generating the potential. The multiple memory cells in this case are called "Reference cells." A desired reference potential is generated by applying a constant current to the multiple reference cells in a high-resistance state and in a low-resistance state. In memory devices that use "Magnetic Tunnel Junction (MTJ)" elements, there is a possibility that the information stored in the MTJ elements is inverted unintentionally due to the following mechanisms. Thus, these memory devices need to be refreshed (rewritten) periodically to ensure reliable readout. In particular, because the reference cells are accessed every time a readout operation is performed and are used as the reference for determining the logical state of stored data, the unintended inversion of their logic is intolerable.

Broadly divided, there are two phenomena that incur the unintended logic inversion. One phenomenon is the logic inversion that occurs with a certain probability in a case where even a minute electric current applied at the time of reading out memory cells falls below a write threshold value. This is called "Read disturb" error. The other phenomenon is the logic inversion taking place with a certain probability because of thermal fluctuation. This is called "Retention" error. Because these are the phenomena that occur with a certain probability, it is important to test and verify, every time data is read out, whether the read operation is performed appropriately, in order to maintain the reliability of the read data. In view of this, proposed are methods that adopt a dedicated sense amplifier to read out the logical state of the memory cells used for generating the reference potential (for example, see PTL 1).

CITATION LIST

Patent Literature

[PTL 1]
Japanese Patent Laid-open No. 2006-286047

SUMMARY

Technical Problems

According to the above-mentioned existing technology, the logical state of the reference cells used for generating the reference potential is tested at predetermined intervals. However, the existing technology incurs a large overhead of the test operation, which makes it difficult to test the reference cells every time they are used for a readout operation. Furthermore, it is necessary to prepare the sense amplifier dedicated to the reference cells, which poses the problem of enlarged circuit area.

The present technology has been devised in view of the above circumstances and is aimed at efficiently testing the reference cells used for reading out data, in order to improve the reliability of the readout data.

Solution to Problems

In solving the above problems and according to a first mode of the present technology, there is provided a memory circuit including multiple memory arrays; a selection circuit configured to select values output from memory cells in any of the multiple memory arrays, so as to supply a first value and a second value; and a sense amplifier that has a first input terminal and a second input terminal and that is configured to amplify and output the first value supplied to the first input terminal in reference to the second value supplied to the second input terminal. This provides an effect such that the values of memory cells in any of the multiple memory arrays are supplied to the first and the second input terminals of the sense amplifier which in turn outputs an amplified value.

Also according to the first mode of the present technology, the selection circuit my include multiple output switches provided corresponding to each of the memory cells, the output switches being configured to control whether or not to output the value from each corresponding memory cell; and a first input selector and a second input selector provided corresponding to the first input terminal and the second input terminal of the sense amplifier, respectively, the first input selector and the second input selector being configured to select output from the output switches and supply the selected output to the corresponding first and second input terminals. This provides an effect of controlling both the output from the memory cells and the input to the sense amplifier.

Also according to the first mode of the present technology, each of the first and second input selectors may be provided with multiple input switches connected to the output of one or more mutually different output switches among the multiple output switches, each of the first and the second input selectors being configured to let any one of the multiple input switches conduct to supply the output therefrom to the corresponding first and second input terminals. This provides an effect such that the first and the second input selectors are each configured with a combination of multiple input switches.

Also according to the first mode of the present technology, at least one of the multiple input switches receives, in a short-circuited state, the output of the multiple output switches connected to each of the input switches. This provides an effect of generating an intermediate potential between the potentials output from multiple reference cells.

Also according to the first mode of the present technology, the number of the multiple output switches connected to each of the multiple input switches may be the same as, or at least partially different from, the number of the input switches. This provides an effect of improving the degree of freedom in design.

Also according to the first mode of the present technology, the memory circuit may further include the multiple sense amplifiers sharing the second input terminal. This provides an effect such that an intermediate potential between the potentials output from the multiple reference cells is referenced as a reference potential.

Also according to the first mode of the present technology, the memory cell is presumably a resistance change memory, for example, or, in particular, a magnetic resistance change memory, for example. However, this also applies to other storage elements that presuppose the use of reference cells.

Also according to the first mode of the present technology, the sense amplifier may perform a process of outputting data reflecting a magnitude relation between a first potential and a second potential supplied respectively to the first input terminal and the second input terminal and a process of outputting data reflecting a magnitude relation between a third potential and a fourth potential supplied respectively to the first input terminal and the second input terminal, the third potential being used to generate the second potential, the fourth potential being different from the second potential. This provides such an effect that the third potential for generating the second potential to be used as a reference potential to read out the first potential is tested by the fourth potential used as a reference potential. That is, in this case, the second potential is a reference potential for reading out the first potential, and the fourth potential is a reference potential for testing the third potential. Incidentally, whichever of these two processes may be performed first.

Also according to the first mode of the present technology, the first potential and the second potential may be read from mutually different memory arrays among the multiple memory arrays, and the third potential and the fourth potential may be read from the same memory array. This provides an effect of performing operation switching between an open-type configuration for readout from different arrays and a folded-type configuration for readout from the same array.

Also according to the first mode of the present technology, the sense amplifier may output the data in a case where the first potential and the second potential are supplied respectively to the first input terminal and the second input terminal and output the data in a case where the third potential and the fourth potential are supplied respectively to the first input terminal and the second input terminal, the data being output either at different timings or at the same timing.

Also according to the first mode of the present technology, the memory circuit may further include a comparator configured to compare the output in a case where the third potential and the fourth potential are supplied respectively to the first input terminal and the second input terminal, with a value expected of the output. This provides an effect of enabling the memory circuit to test the reference cells.

Advantageous Effects of Invention

The present technology provides advantageous effects of efficiently testing the reference cells used for reading out data and thereby improving the reliability of the readout data. It is to be noted that the advantageous effects outlined above are not limitative of the present disclosure and that further advantages will become apparent from a reading of the present disclosure.

BRIEF DESCRIPTION OF DRAWINGS

FIG. 7 is a view depicting an example of selection control by the column selection circuits 150 in the first embodiment of the present technology.

DESCRIPTION OF EMBODIMENTS

The modes for implementing the present technology (referred to as the embodiments) are described below. The description will be given in the following order.
1. First embodiment (an example in which memory cell outputs are selected by column selection circuits)
2. Second embodiment (an example in which the values of data cells and reference cells are output sequentially)
3. Third embodiment (an example in which the values of data cells and reference cells are output simultaneously)
4. Fourth embodiment (an example in which a comparison with the expected value of reference cells is performed inside the memory circuit)
5. Usage examples 1. First Embodiment

Figure 1:
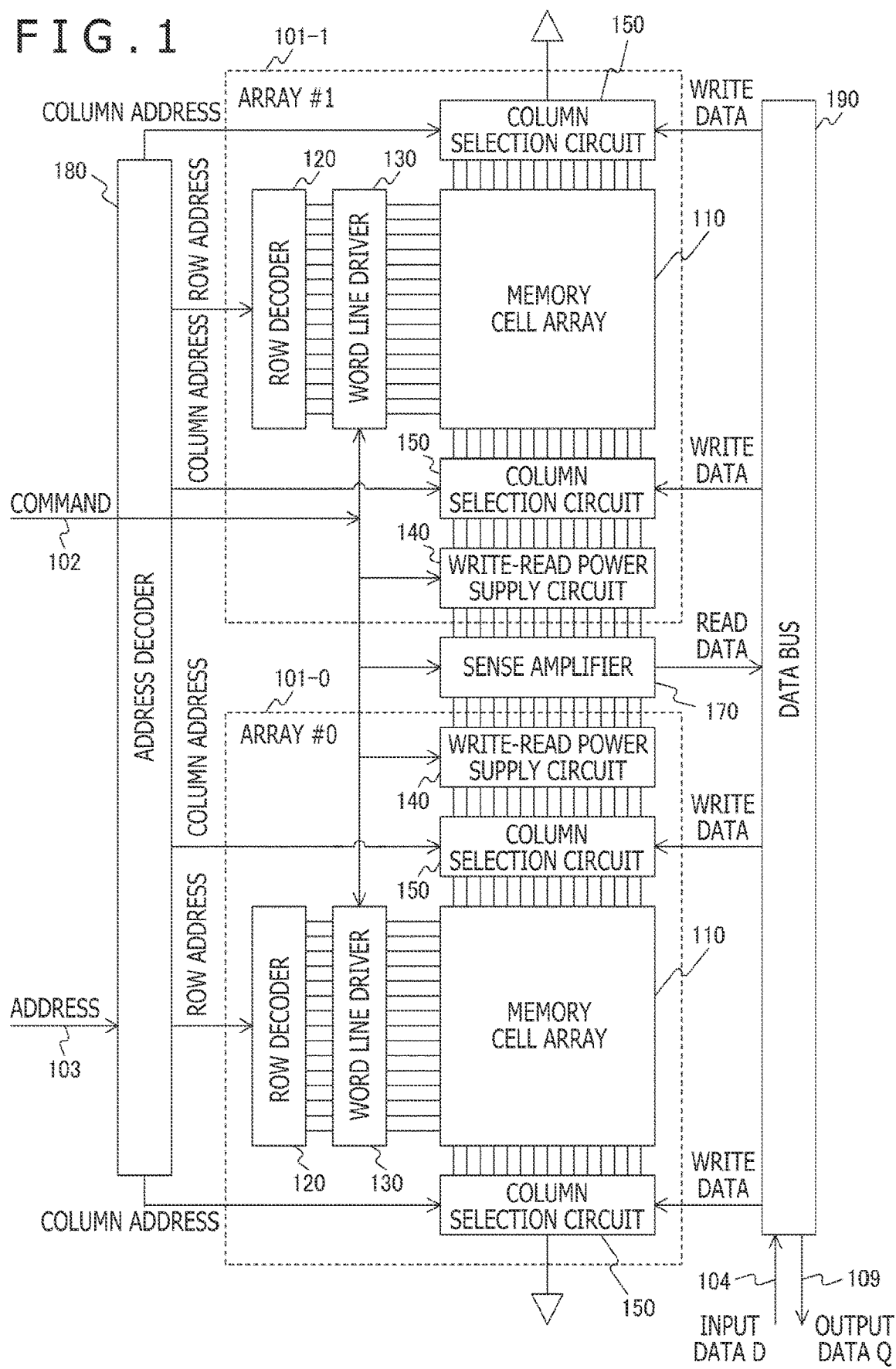
FIG. 1 is a view depicting a configuration example of a memory circuit as a first embodiment of the present technology.

[Memory Circuit]
FIG. 1 is a view depicting a configuration example of a memory circuit as a first embodiment of the present technology.

This memory circuit includes two arrays #0 (101-0) and #1 (101-1), a sense amplifier 170, an address decoder 180, and a data bus 190.

Each of the arrays 101-0 and 101-1 includes a memory cell array 110. The memory cell array 110 includes memory cells arranged in a two-dimensional matrix pattern (array pattern).

The address decoder 180 decodes the address designated by a processor via a signal line 103, so as to generate a row address and a column address for the memory cell array 110.

The sense amplifier 170 amplifies and outputs the value read out from each of the arrays 101-0 and 101-1. One sense amplifier 170 is provided corresponding to one column or multiple examples in the memory cell array 110. Each of the sense amplifiers 170 has two input terminals. One input terminal receives input of the potential of a sense target, and the other input terminal receives input of a reference potential. This allows the sense amplifier 170 to output read data by amplifying the potential of the sense target in reference to the reference potential. That is, the sense amplifier 170 outputs data reflecting a magnitude relation between the levels of potential supplied to the two input terminals.

The data bus 190 is a bus that permits data output and input to and from the processor. That is, the data bus 190 outputs the read data from the sense amplifier 170 to the processor via an output data Q terminal 109. The data bus 190 further receives write data from the processor via an input data D terminal 104 and supplies the write data to the arrays 101-0 and 101-1.

Each of the arrays 101-0 and 101-1 includes a row decoder 120, a word line driver 130, a write-read power supply circuit 140, and a column selection circuit 150, in addition to the memory cell array 110. The row decoder 120 decodes the row address supplied from the address decoder 180. The word line driver 130 drives a word line decoded by the row decoder 120. The write-read power supply circuit 140 is a circuit that supplies power required for a write or read operation. The column selection circuit 150 selects a column from the memory cell array 110 according to the column address supplied from the address decoder 180. Incidentally, the column selection circuit 150 is an example of the selection circuit described in the appended claims.

Each of the arrays 101-0 and 101-1 is supplied with commands from the processor via a signal line 102. Each of the arrays 101-0 and 101-1 performs necessary operations such as read or write operation in accordance with the supplied commands.

Figure 2:
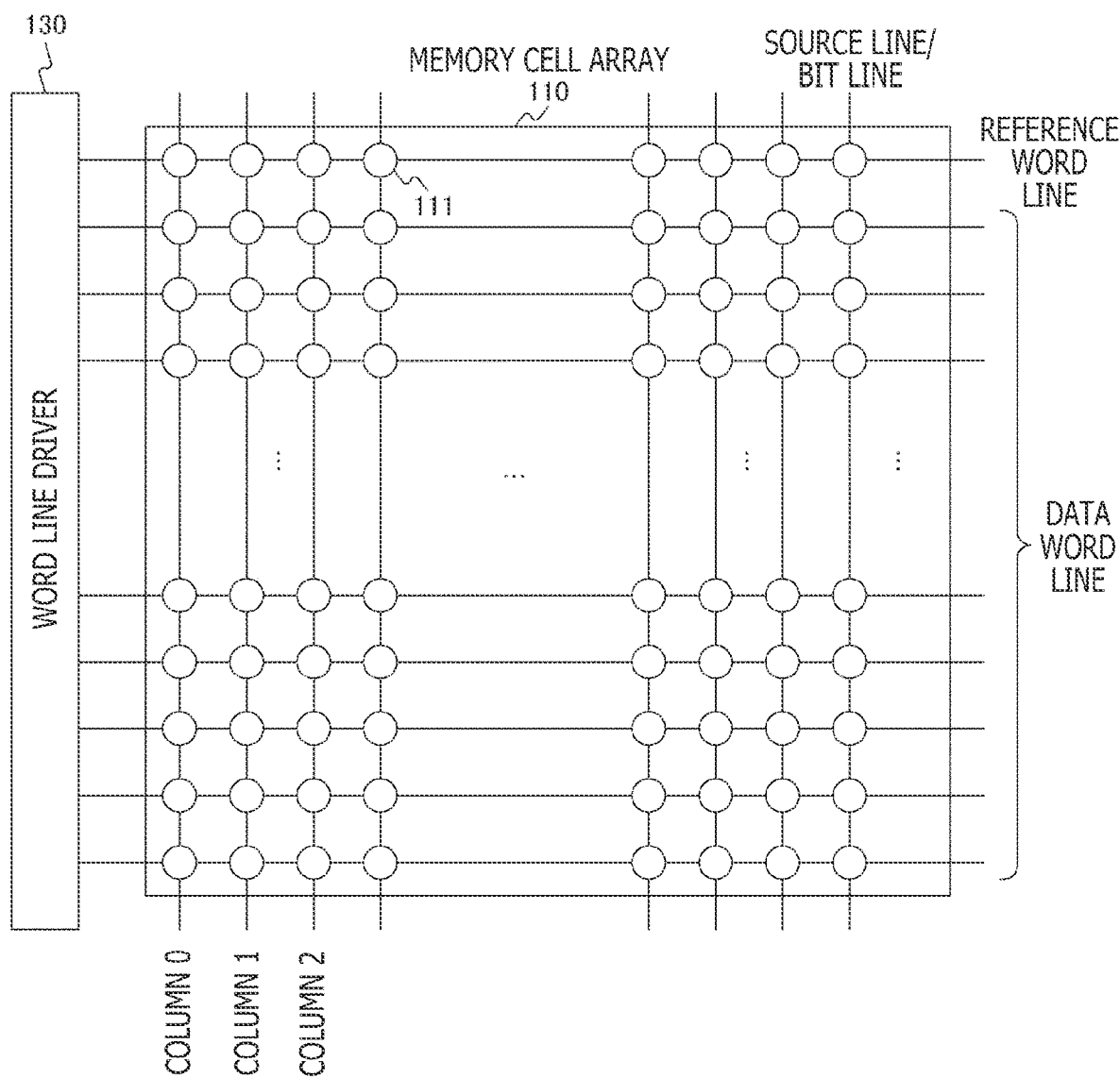
FIG. 2 is a view depicting a configuration example of a memory cell array 110 in the first embodiment of the present technology.

[Memory Cell Arrays]
FIG. 2 is a view depicting a configuration example of a memory cell array 110 in the first embodiment of the present technology.

The memory cell array 110 includes the memory cells 111 arranged in a two-dimensional matrix pattern. The memory cells 111 in the memory cell array 110 are driven by the word line driver 130 in units of row-direction word lines. Further, source lines and bit lines are formed in the column direction and are connected serially with each of the memory cells 111.

The word lines in the memory cell array 110 include data word lines used as a normal data storage region and reference word lines used as reference cells. As explained above, the reference cells are used to generate the reference potential for data readout.

In the case of an open-type configuration, the reference cells are arrayed in the word line direction. That is, access to reference cells requires activation of the word line of the specific reference cells (reference word line: RWL).

Whereas the reference word line in this example is placed in the top row of the memory cell array 110, the reference word line may be arranged in any row. For example, arranging the reference word line in the center row of the memory cell array 110 is preferred in view of parasitic resistance.

Figure 3:
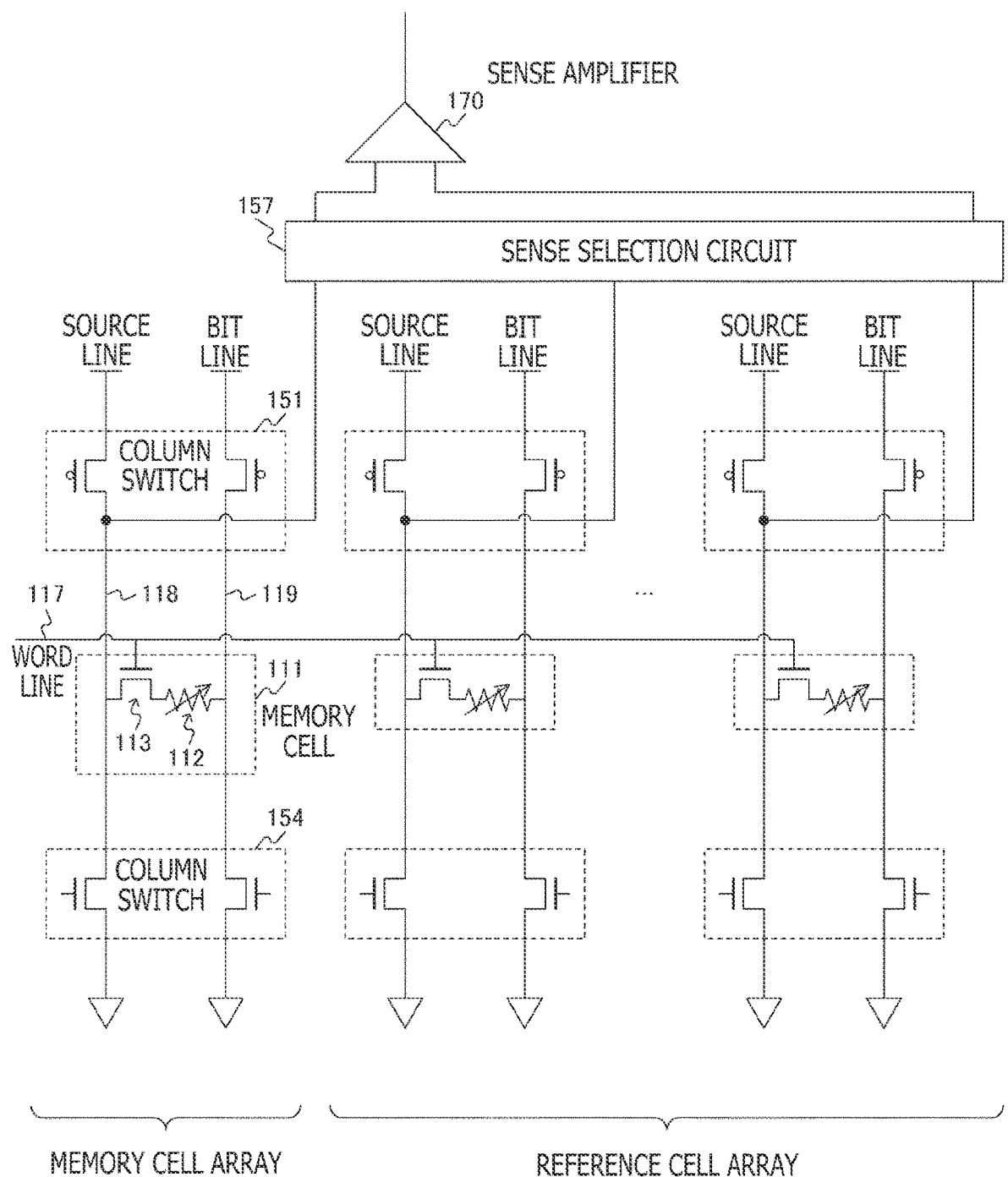
FIG. 3 is a view depicting typical relations between a memory cell 111 and a column selection circuit 150 in the first embodiment of the present technology.

FIG. 3 is a view depicting typical relations between a memory cell 111 and a column selection circuit 150 in the first embodiment of the present technology.

The memory cell 111 includes a resistance change element 112 and a switch 113 connected in series between a source line 118 and a bit line 119. For example, a magnetic tunnel junction (MTJ) element is presumably used as the resistance change element 112. The MTJ element is structured with two layers of magnetic materials sandwiching an insulating layer. A variable magnetized state of the magnetic materials causes a varying value of electric resistance to appear. Whereas the resistance change MTJ element is presumably used as the storage element of the memory cell 111 in this example, other storage elements that presuppose the use of reference cells such as "Ferroelectric Random Access Memory (FeRAM)" may be used alternatively with this embodiment.

The gate electrode of the switch 113 is connected with a word line 117. Driving the word line 117 causes the switch 113 to conduct and thereby connect both ends of the resistance change element 112 to the source line 118 and to the bit line 119.

The source line 118 and the bit line 119 are connected with column switches 151 and 154 for each column. Suitably controlling these switches varies the state of the resistance change element 112 or allows its varied state to be read out.

The value read from the memory cell 111 is input to a sense selection circuit 157 before being fed to the sense amplifier 170. The sense amplifier 170 has two input terminals. One input terminal receives input of sense target data, and the other input terminal receives input of the reference potential. The sense selection circuit 157 selects values read out from the memory cells 111 in such a manner as to supply appropriate values to the two input terminals of the sense amplifier 170. Whereas a source line signal is input to the sense selection circuit 157 in this example, a bit line signal instead of the source line signal may be input depending on the characteristics of the memory cells 111.

Figure 4:
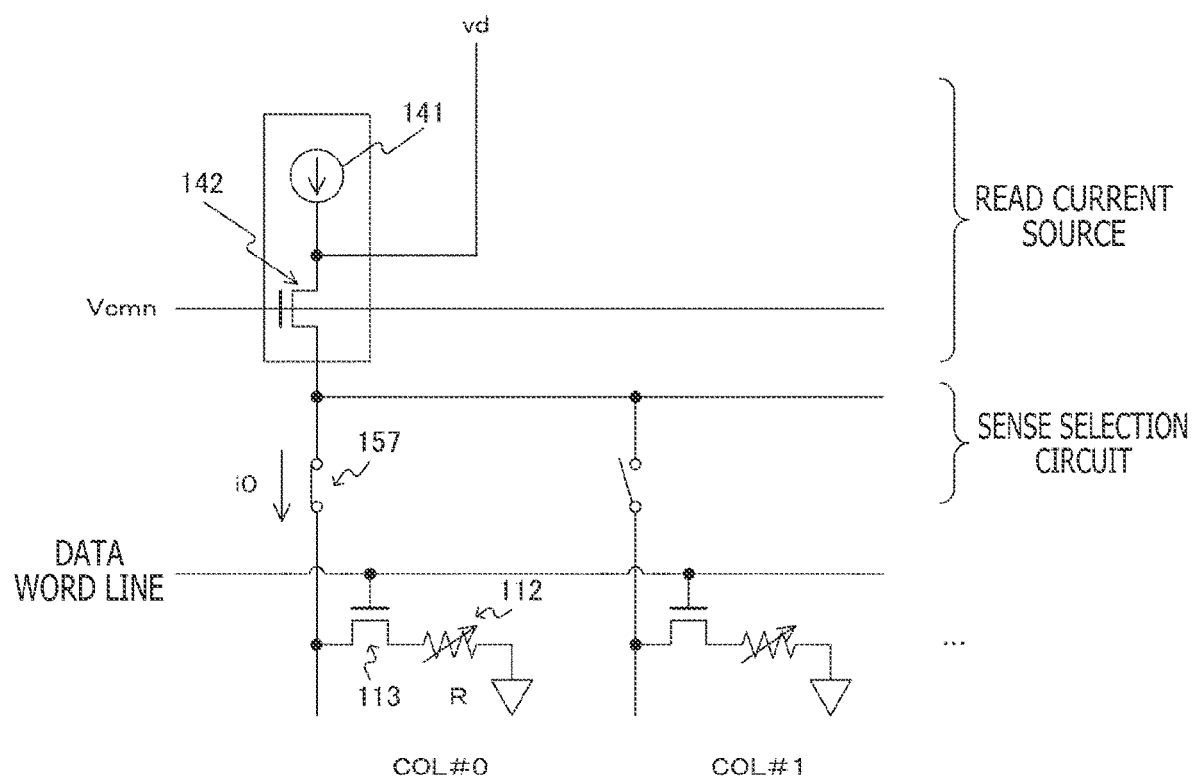
FIG. 4 is a view depicting a typical state in which the memory cell 111 is read out as a data cell in the first embodiment of the present technology.

FIG. 4 is a view depicting a typical state in which the memory cell 111 is read out as a data cell in the first embodiment of the present technology.

In a resistance change memory, for example, the logical value is assigned depending on the resistance value, such as "1" if the resistance value R of the memory cell is a high-resistance state (RH) and "0" if its resistance value R is a low-resistance state (RL). When the logical value is determined by the two-input sense amplifier 170, the resistance value needs to be converted to an input potential. For this reason, a current injection amplifier is adopted. In this example, a current source 141 and a switch 142 are used as a read current source.

The current source 141 is designed to let a current flow through the resistance of the memory cell 111. The switch 142 is designed to control the operation as that of the read current source. Applying a voltage Vcmn to the gate electrode of the switch 142 causes the switch 142 to conduct and let a current flow through the resistance of the memory cell 111.

The sense selection circuit 157 is connected interposingly between the read current source and the memory cell 111. This allows the current to be supplied only to the memory cell 111 selected by the sense selection circuit 157, for data readout.

In this case, if it is assumed that iO stands for the value of the current supplied from the current source 141, R for the resistance value of the resistance change element 112, and m for the amplification factor of the current injection amplifier, then a potential vd of an observation end becomes progressively equal to "m×iO×R." Thus, measuring the potential input to the sense amplifier 170 makes it possible to obtain the resistance value R of the resistance change element 112.

Figure 5:
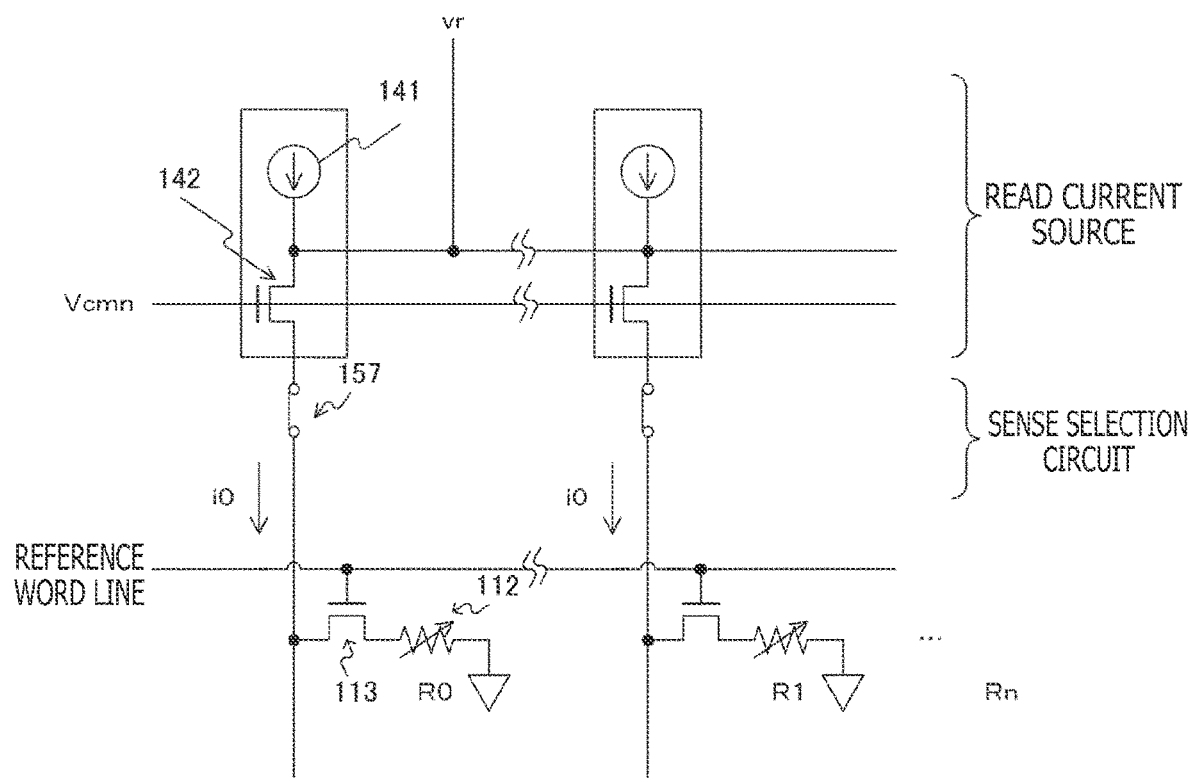
FIG. 5 is a view depicting a typical state in which the memory cell 111 is read out as a reference cell in the first embodiment of the present technology.

FIG. 5 is a view depicting a typical state in which the memory cell 111 is read out as a reference cell in the first embodiment of the present technology.

Whereas there may be a number of methods to generate the reference potential for determining the logical value, it is appropriate to use memory cells also for generating the reference potential. That is in consideration of the robustness of sense operation. For example, in a case where some parameter variations during the process of memory cell production cause bias to be applied to the resistance value of the sense target memory cells, similar bias is also applied to the reference potential correspondingly. Such bias application cancels out the adverse effects involved.

Thus, in this example, output potentials from multiple memory cells (reference cells) are short-circuited (shorted) to generate an intermediate potential. For this purpose, multiple sense selection circuits 157 are caused to conduct. In this case, on the assumption that iO stands for the value of the current supplied from the current source 141, Ri (i=0 to (n−1)) for the resistance value of the resistance change element 112, and m for the amplification factor of the current injection amplifier, a potential vr on the observation end becomes progressively equal to "m×iO×ΣRi/n."

The number n of connections is at least one. The larger the number n of connections, the more robust the sense operation becomes against resistance variations of the reference cells. An optimum ratio between the high-resistance state (RH) and the low-resistance state (RL) is not necessarily limited to 1:1. The optimum ratio varies depending on the operating point of the sense amplifier 170.

The two observation ends thus generated are connected to the two inputs of the sense amplifier 170. This allows the logical state of the sense target to be observed.

[Column Selection Circuits]

Figure 6:
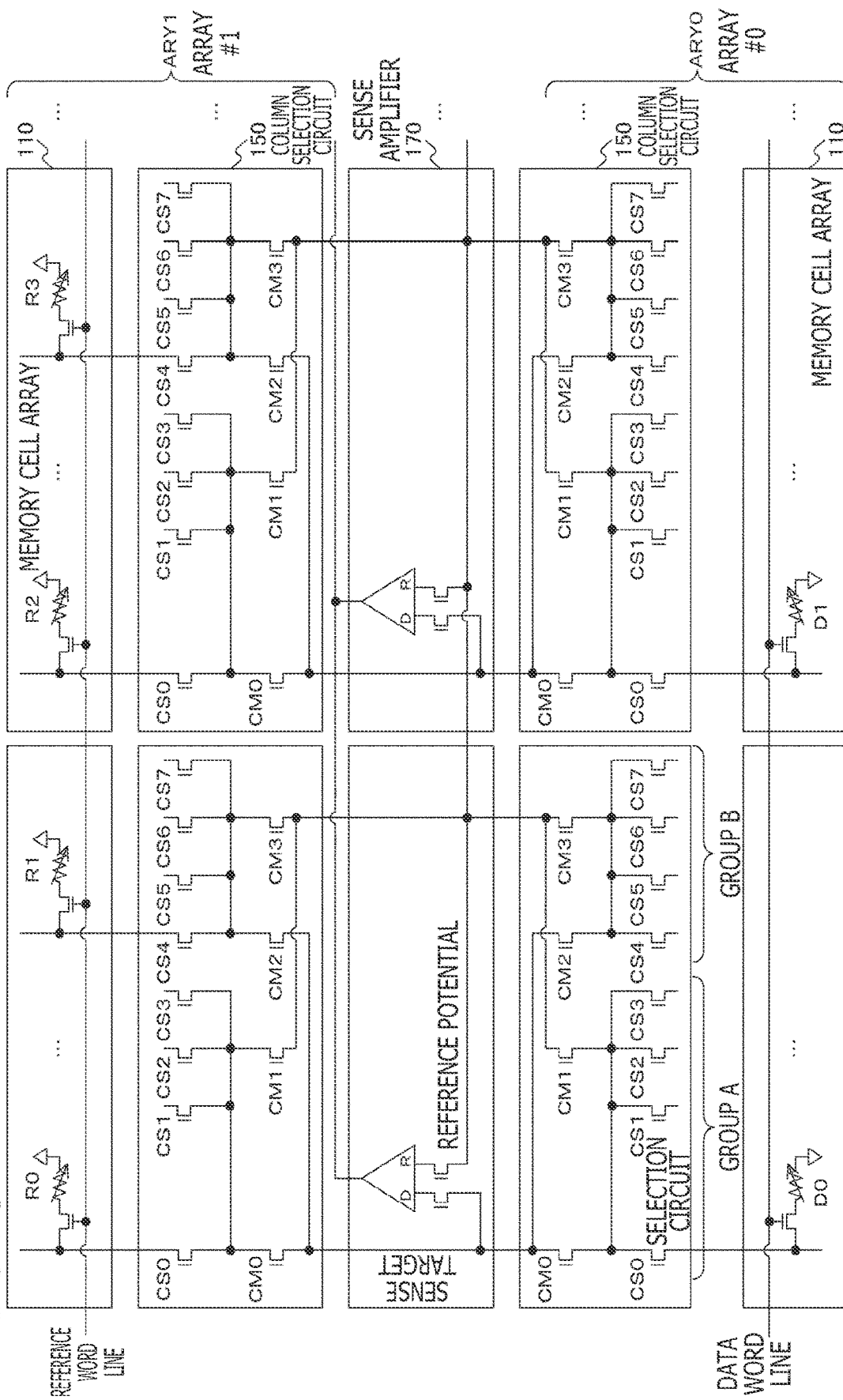
FIG. 6 is a view depicting a configuration example of the column selection circuits 150 in the first embodiment of the present technology.

FIG. 6 is a view depicting a configuration example of the column selection circuits 150 in the first embodiment of the present technology.

In each of the arrays 101-0 and 101-1, the column selection circuit 150 selects the values of the memory cells 111 in the memory cell array 110 and supplies the selected values to the two input terminals of the sense amplifier 170. As described above, each sense amplifier 170 is shared by two arrays 101-0 and 101-1. The value of the memory cell 111 can be supplied from any one of the arrays 101-0 and 101-1.

In this example, the constant current source and the write power supply are omitted for the purpose of simplification. What is depicted here is an example in which eight source lines and eight bit lines are connected to one sense amplifier, the lines being divided into two groups of A and B of four each. Note that the number of lines in each group is only an example and is allowed to vary as long as the source lines and bit lines connected to the sense amplifier are divided into at least two groups.

It is also depicted that the data cells on the side of the array 101-0 are accessed as the access target and that the reference cells on the side of the array 101-1 are used. All column selection circuits 150 share a common configuration. A desired connection state is achieved by varying the selected states of internal switches in the arrays 101-0 and 101-1.

Further, the lines that short-circuit (short) the nodes on the reference potential side of the sense amplifiers 170 are connected to the sense amplifiers 170 of which the number corresponds to the above-mentioned number n of connections. That is, a unit of circuits provided corresponding to the above-mentioned n sense amplifiers is arranged repeatedly in the layout of an actual memory circuit.

The column selection circuit 150 includes output switches CS0 to CS7 corresponding to each of the memory cells 111 in each column. The output switches CS0 to CS7 control whether or not to output value from the memory cell 111.

The column selection circuit 150 further includes two input selectors corresponding to each of the two input terminals of the sense amplifier 170. These input selectors select the outputs from the output switches CS0 to CS7 and supply what is selected to the two input terminals of the corresponding sense amplifier 170. Each of the input selectors includes multiple input switches connected to the outputs of one or more mutually different output switches among the output switches CS0 to CS7. One of the input switches is caused to conduct and supply its output to the corresponding input terminal. Specifically, a sense target input terminal D of the sense amplifier 170 is connected with an input selector that includes input switches CM0 and CM2. Further, a reference potential input terminal R of the sense amplifier 170 is connected with an input selector that includes input switches CM1 and CM3.

As described above, when the reference potential is to be generated, an intermediate potential may be generated by short-circuiting (shorting) the potentials output from multiple reference cells. At least one of the multiple input switches CM0 to CM3 receives, in a short-circuited state, the outputs of the multiple output switches CS0 to CS7 connected to each of the input switches. For example, when the intermediate potential is to be generated from the reference cells connected to the output switches CS0 to CS3, the output switches CS0 to CS3 are brought into a connected state, and the input switch CM1 is brought into a connected state for connection with the nodes on the reference potential side of the sense amplifier 170. Because the nodes on the reference potential side of the sense amplifier 170 are interconnected, the outputs are also short-circuited for this connection line.

[Selection Control by the Column Selection Circuits]

FIG. 7 is a view depicting an example of selection control by the column selection circuits 150 in the first embodiment of the present technology.

Four cases are presented below as examples of selection control by the column selection circuits 150 for each target of which the logical value is determined by the sense amplifier 170.

Case #1 assumes that the reference cells of the array 101-1 are to be tested. In order to test the logical value of R0 and R2 in the array 101-1, the corresponding cells are connected to the sense target input of the sense amplifier 170. At this point, the reference potential generated with R1 and R3 is connected to the reference potential input of the sense amplifier 170.

In this case, there is no input from the array 101-0. For this reason, the input switches CM0 to CM3 of the array 101-0 are all controlled to be in an insulated state. That means the output switches CS0 to CS7 of the array 101-0 may be in any state. With the array 101-1, on the other hand, the output switches CS0 and CS4 are controlled to be in a conducting state, whereas the output switches CS1 to CS3 and CS5 to CS7 are controlled to be in an insulated state. The input switches CM0 and CM3 are then controlled to be in a conducting state, and the input switches CM1 and CM2 are controlled to be in an insulated state.

Figure 8:
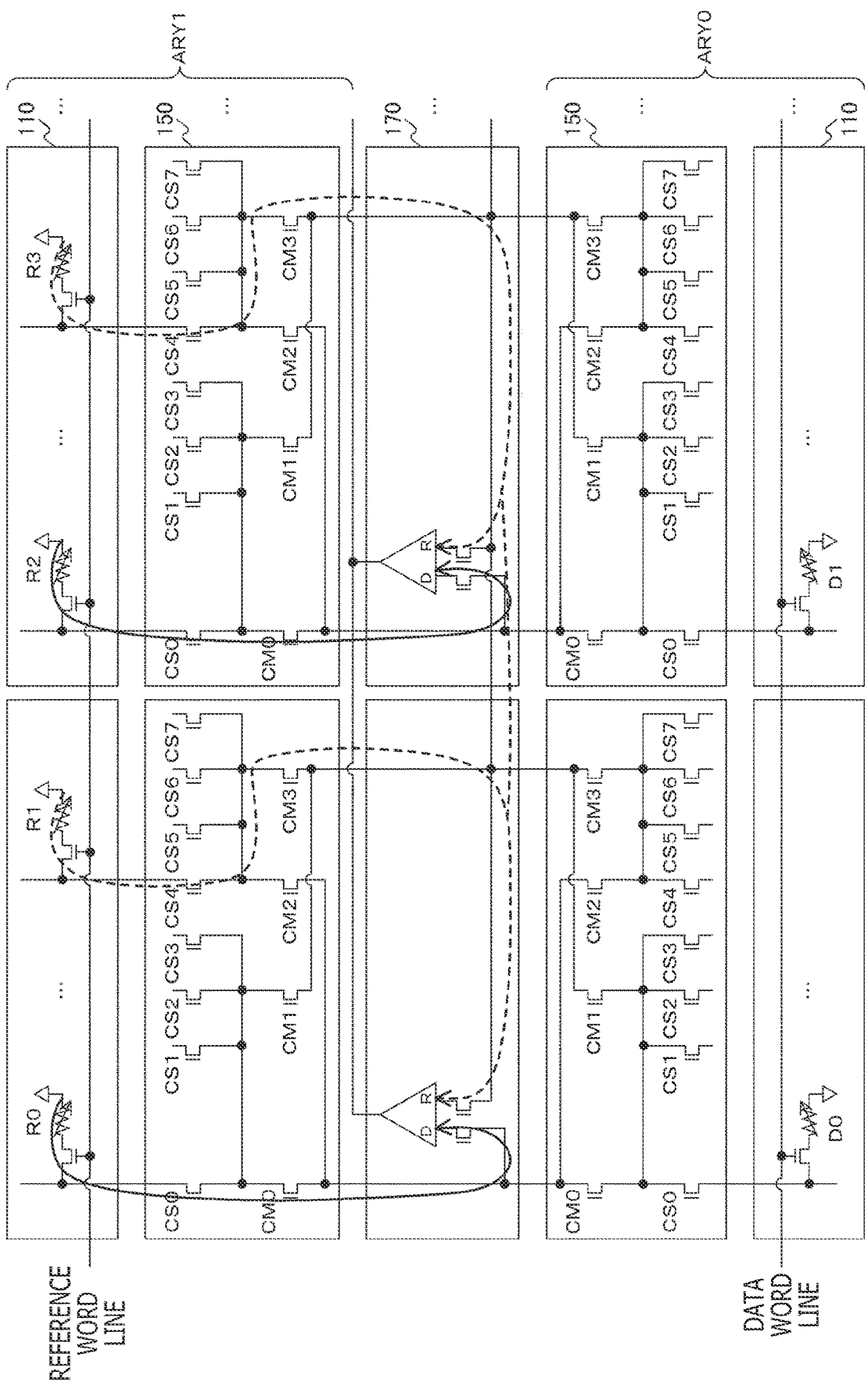
FIG. 8 is a view depicting an example of case 1 of selection control by the column selection circuits 150 in the first embodiment of the present technology.

The above processes of control bring about the connections depicted in FIG. 8. That is, the values R0 and R2 of the reference cells and the values R1 and R3 for testing the reference cells are all read out from the array 101-1. In such a manner, the reference cells targeted for testing (R0 and R2) are tested individually. On the other hand, the cells (R1 and R3) for generating the reference potential are used collectively. Incidentally, in FIG. 8 and subsequent drawings, the sense target potential is indicated by a solid line and the reference potential by a broken line.

Case #2 assumes that the reference cells in the array 101-1 are to be tested as in case #1. In order to determine the logical value of R1 and R3 in the array 101-1, R0 and R2 are used to connect the reference potential to the reference potential input of the sense amplifier 170.

In this case, as in case #1, there is no input from the array 101-0. For this reason, the input switches CM0 to CM3 of the array 101-0 are all controlled to be in an insulated state. That means the output switches CS0 to CS7 of the array 101-0 may be in any state. With the array 101-1, on the other hand, the output switches CS0 and CS4 are controlled to be in a conducting state, whereas the output switches CS1 to CS3 and CS5 to CS7 are controlled to be in an insulated state. The input switches CM1 and CM2 are then controlled to be in a conducting state, and the input switches CM0 and CM3 are controlled to be in an insulated state.

Figure 9:
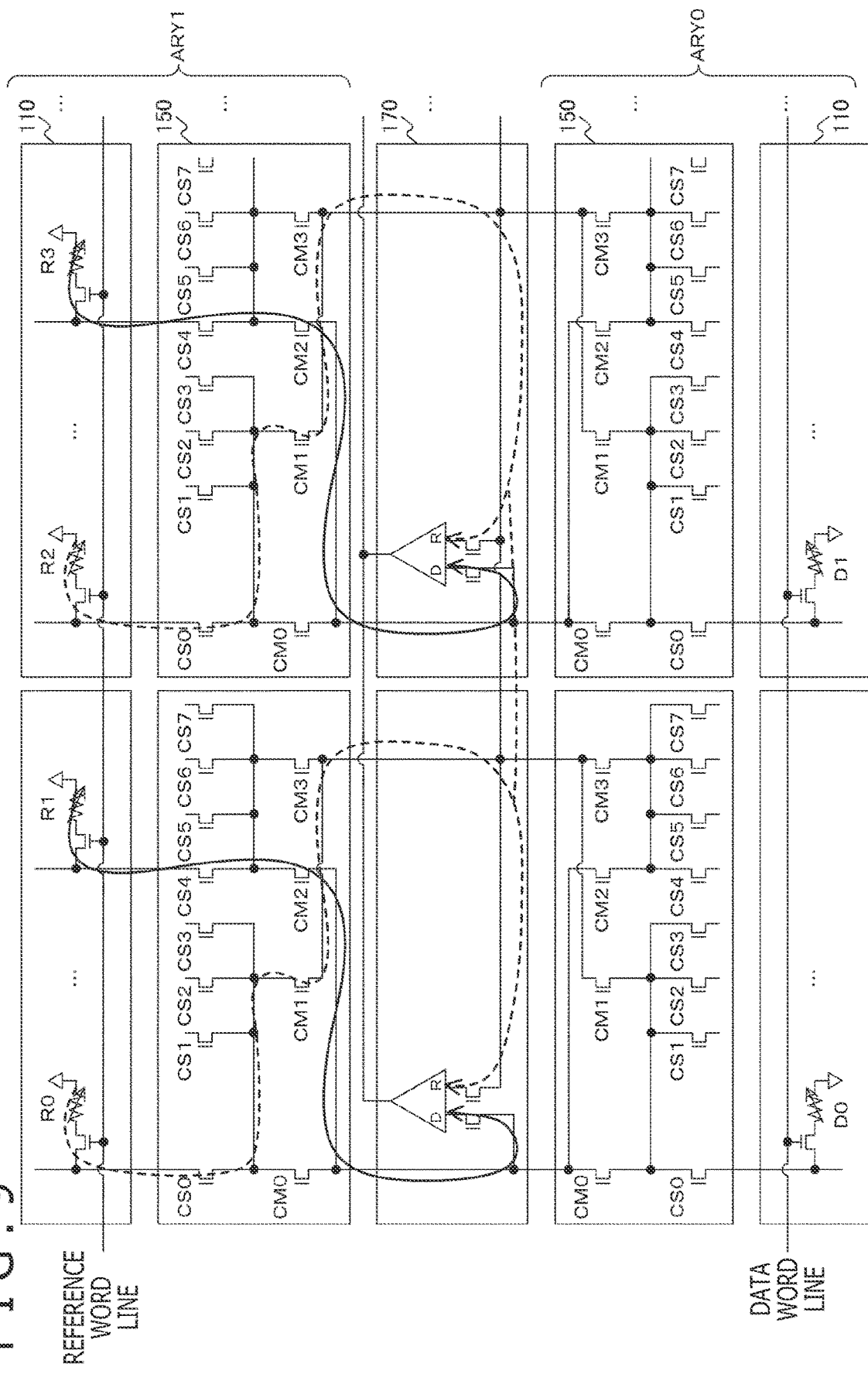
FIG. 9 is a view depicting an example of case 2 of selection control by the column selection circuits 150 in the first embodiment of the present technology.

The above processes of control bring about the connections depicted in FIG. 9. That is, the values input to the sense amplifier 170 can be set to be the inverse of that in the above-described case #1.

Case #3 assumes that normal cells in the array 101-0 are to be read out. Cells D0 and D1 in the array 101-0 are connected to the sense target input. At this point, the reference potential generated by R0 and R2 is connected to the reference potential input of the sense amplifier.

In this case, there is no input from group B in the arrays 101-0 and 101-1. For this reason, the input switches CM2 and CM3 are controlled to be in an insulated state. The output switches CS4 to CS7 may be in any state. In group A, on the other hand, the output switch CS0 is controlled to be in a conducting state, whereas the output switches CS1 to CS3 are controlled to be in an insulated state. Further, in the array 101-0, the input switch CM0 is controlled to be in a conducting state, and the input switches CM1 to CM3 are controlled to be in an insulated state. In addition, in the array 101-1, the input switch CM1 is controlled to be in a conducting state, and the input switches CM0, CM2, and CM3 are controlled to be in an insulated state.

Figure 10:
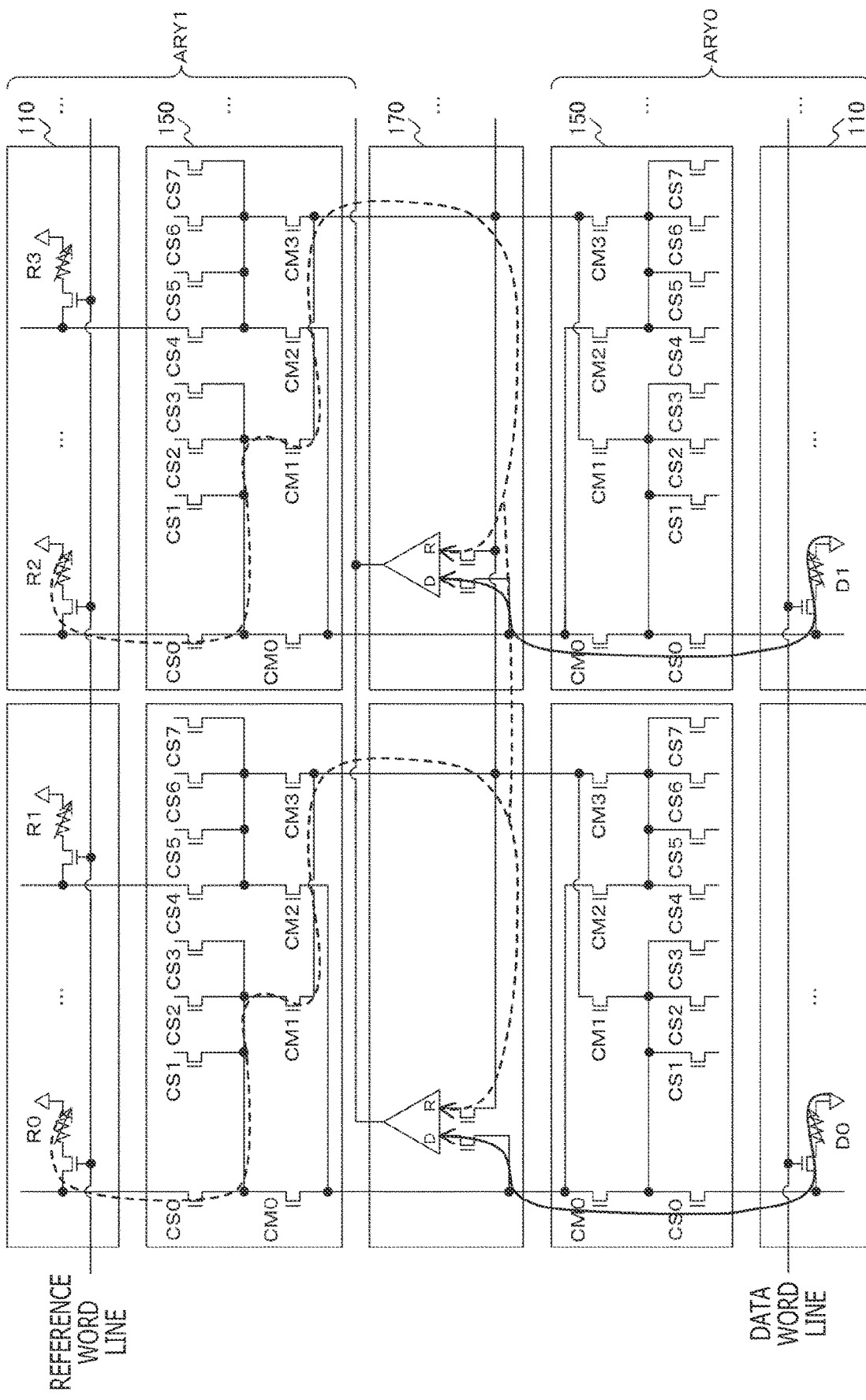
FIG. 10 is a view depicting an example of case 3 of selection control by the column selection circuits 150 in the first embodiment of the present technology.

The above processes of control bring about the connections depicted in FIG. 10. That is, the values D0 and D1 of normal cells are read out from the array 101-0, and the reference potential values R0 and R2 of the reference cells are read out from the array 101-1.

Case #4 assumes that normal cells in the array 101-0 are to be read out as in case #3. The cells D0 and D1 in the array 101-0 are connected to the sense target input. At this point, the reference potential generated by R1 and R3 is connected to the reference potential input of the sense amplifier 170.

In this case, there is no input from group B in the array 101-0. For this reason, the input switches CM2 and CM3 are controlled to be in an insulated state. The output switches CS4 to CS7 may be in any state. Further, there is no input from group A in the array 101-1, so that the input switches CM0 and CM1 are controlled to be in an insulated state and that the output switches CS0 to CS3 may be in any state.

Further, in the array 101-0, the output switch CS0 and the input switch CM0 are controlled to be in a conducting state. The other output switches CS1 to CS3 and input switches CM1 to CM3 in group A are controlled to be in an insulated state. In addition, in the array 101-1, the output switch CS4 and the input switch CM3 are controlled to be in a conducting state. The other output switches CS5 to CS7 and input switches CM0 to CM2 in group B are controlled to be in an insulated state.

Figure 11:
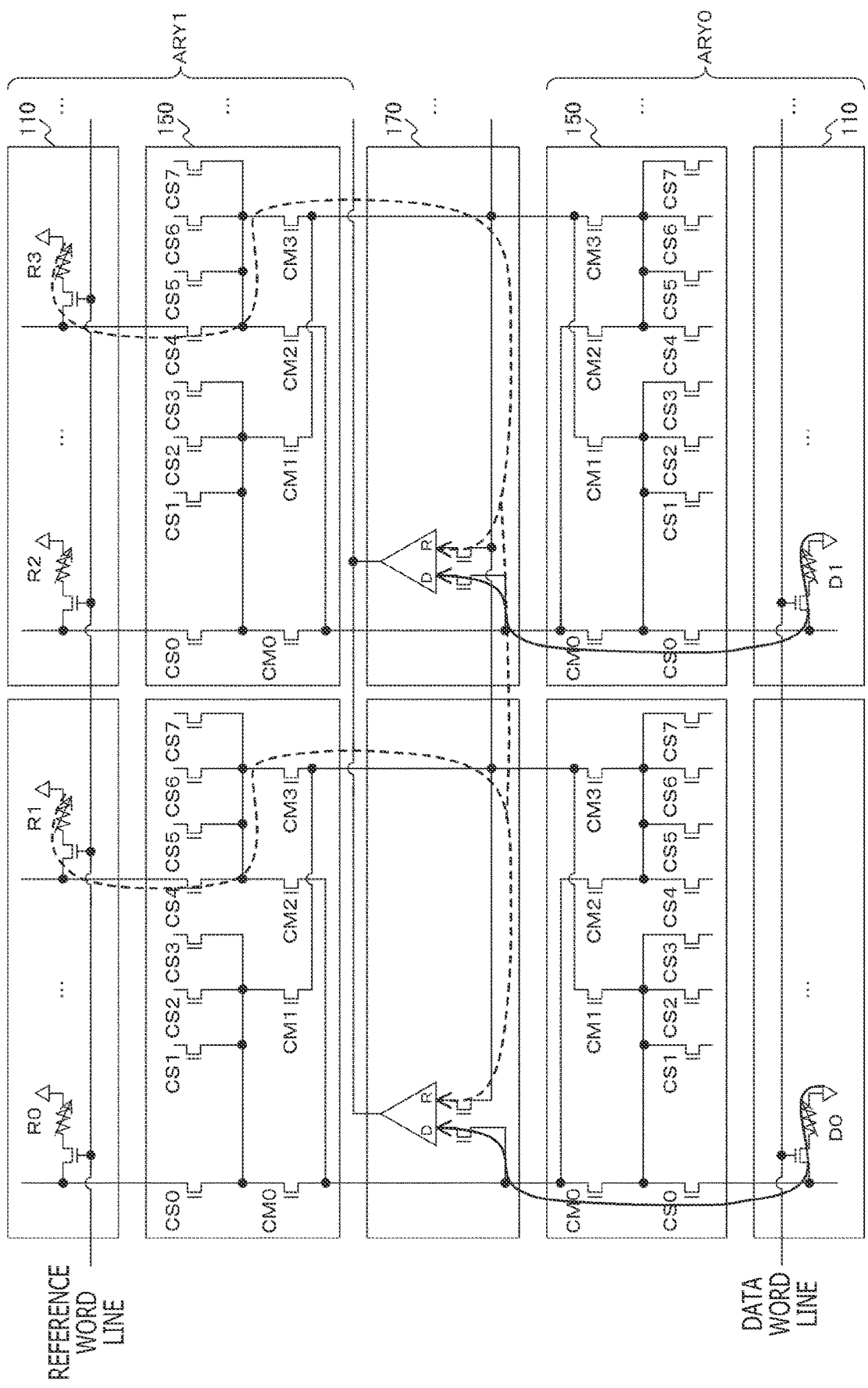
FIG. 11 is a view depicting an example of case 4 of selection control by the column selection circuits 150 in the first embodiment of the present technology.

The above processes of control bring about the connections depicted in FIG. 11. That is, the values D0 and D1 of normal cells are read out from the array 101-0, and the reference potential values R1 and R3 of the reference cells are read out from the array 101-1.

As described above, in a case where the sense target and the memory cells for generating the reference potential are not in the same group of the same array, the switches of the column selection circuits 150 are switched in such a manner that the logical value of the memory cell 111 in a desired position is read out by use of the reference potential generated by desired reference cells. Obviously, the memory cell 111 in a position not explicitly indicated here can be accessed likewise by controlling the switches of the column selection circuits 150.

According to the first embodiment of the present technology, as discussed above, the value of any memory cell is selected as desired by the column selection circuits 150 from the arrays 101-0 and 101-1 before being supplied to the input terminals of the sense amplifier 170. In this manner, an open-type configuration that permits readout from different arrays and a folded-type configuration that enables readout from the same array can be switched in operation.

Alternative Examples

Figure 12A:
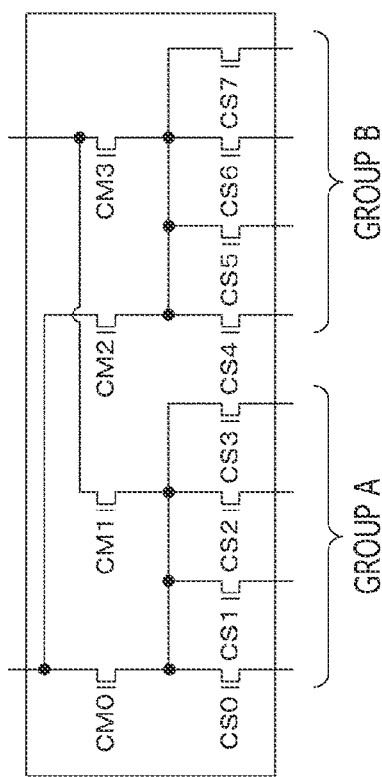
FIGS. 12A and 12B are views depicting typical groups of the column selection circuits 150 in an alternative example of the first embodiment of the present technology.
Figure 12B:
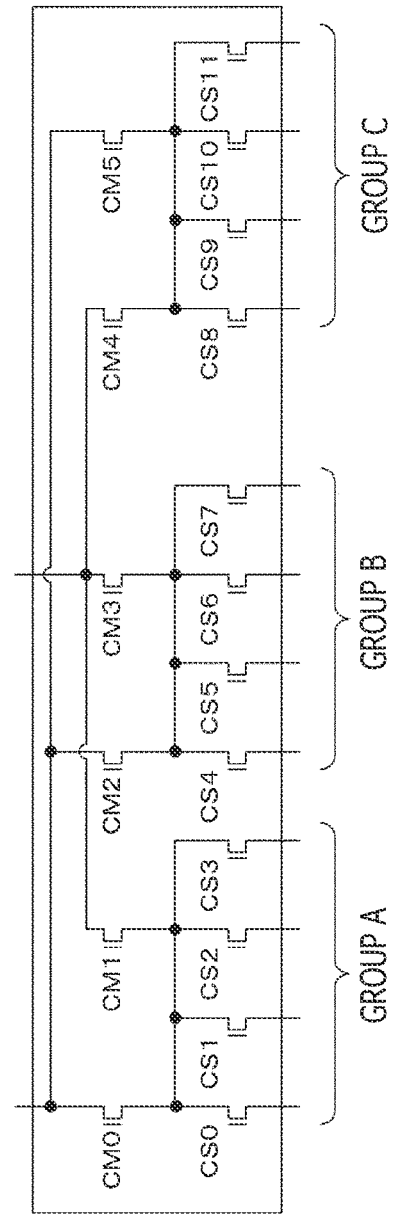

FIGS. 12A and 12B are views depicting typical groups of the column selection circuits 150 in an alternative example of the first embodiment of the present technology.

In the above-described embodiment, the column selection circuits 150 are divided into two groups of A and B as indicated in FIG. 12A. Alternatively, as indicated in FIG. 12B, for example, the column selection circuits 150 may be divided into three groups of A, B, and C. As another alternative, the column selection circuits 150 may be divided into four or more groups.

Figure 13A:
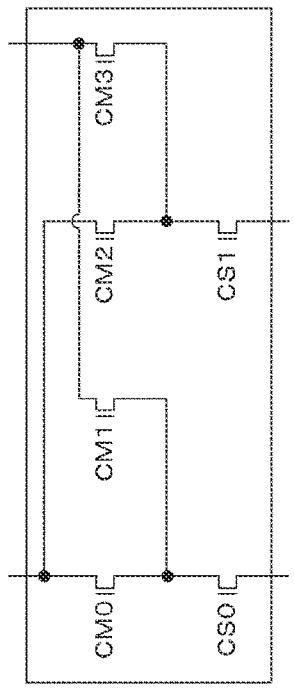
FIGS. 13A, 13B, and 13C are views depicting other typical groups of the column selection circuits 150 in other alternative examples of the first embodiment of the present technology.
Figure 13B:
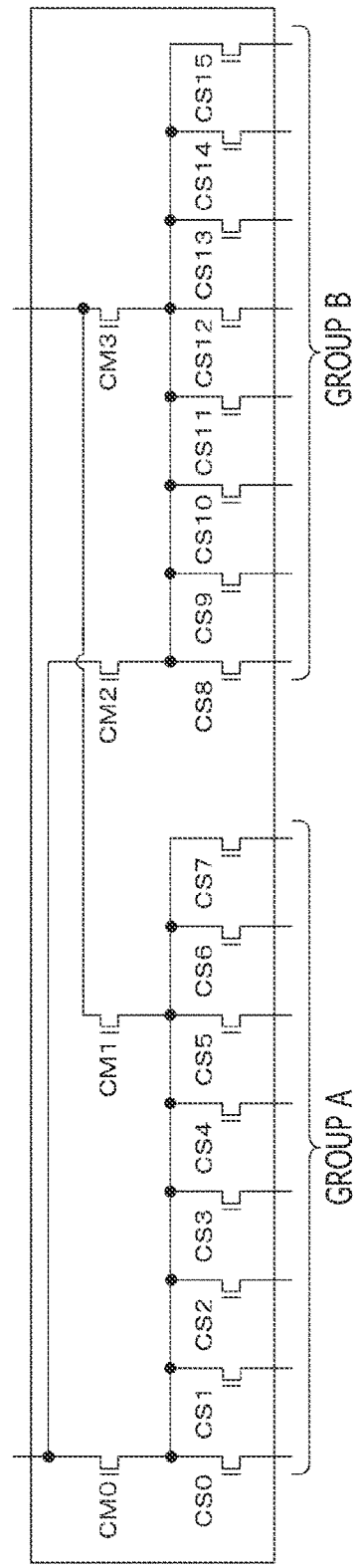
Figure 13C:
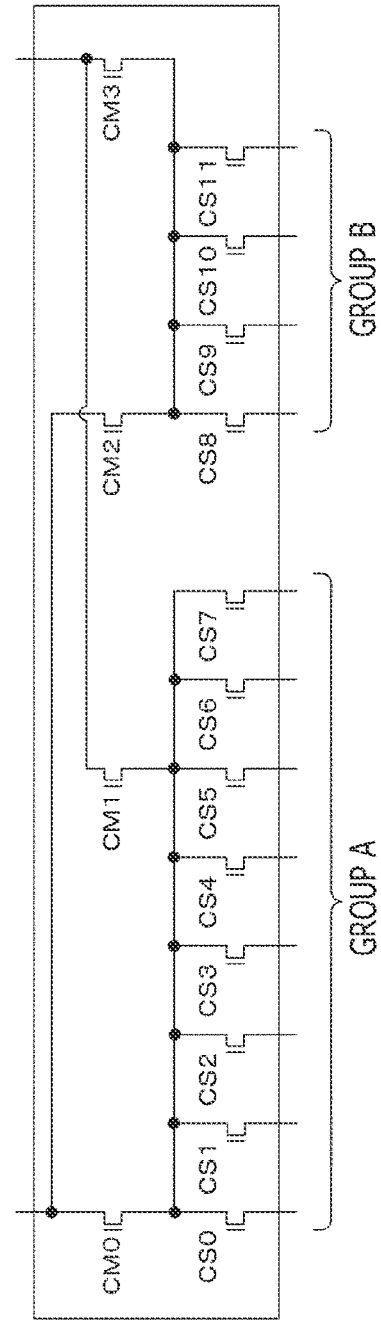

FIGS. 13A, 13B, and 13C are views depicting other typical groups of the column selection circuits 150 in other alternative examples of the first embodiment of the present technology.

In the above-described embodiment, four source lines and four bit lines are connected to each of the groups. Alternatively, one source line and one bit line may be connected to each of the groups as indicated in FIG. 13A. As another alternative, eight source lines and eight bit lines may be connected to each of the groups as indicated in FIG. 13B. That is, the number of source lines and that of bit lines to be connected to each group may be other than four.

As another alternative, the number of lines in each of the groups may vary from one group to another as indicated in FIG. 13C, for example. In this example, eight output switches CS0 to CS7 are connected to the input switches CM0 and CM1, and four output switches CS8 to CS11 are connected to the input switches CM2 and CM3. That is, the number of multiple output switches among CS0 to CS11 to be connected to each of the multiple input switches CM0 to CM3 may be at least partially different.

As described above, the group configuration of the column selection circuits 150 may be set for each system. This permits circuit design with a high degree of freedom in consideration of memory endurance.

2. Second Embodiment

[Memory Circuit]

Figure 14:
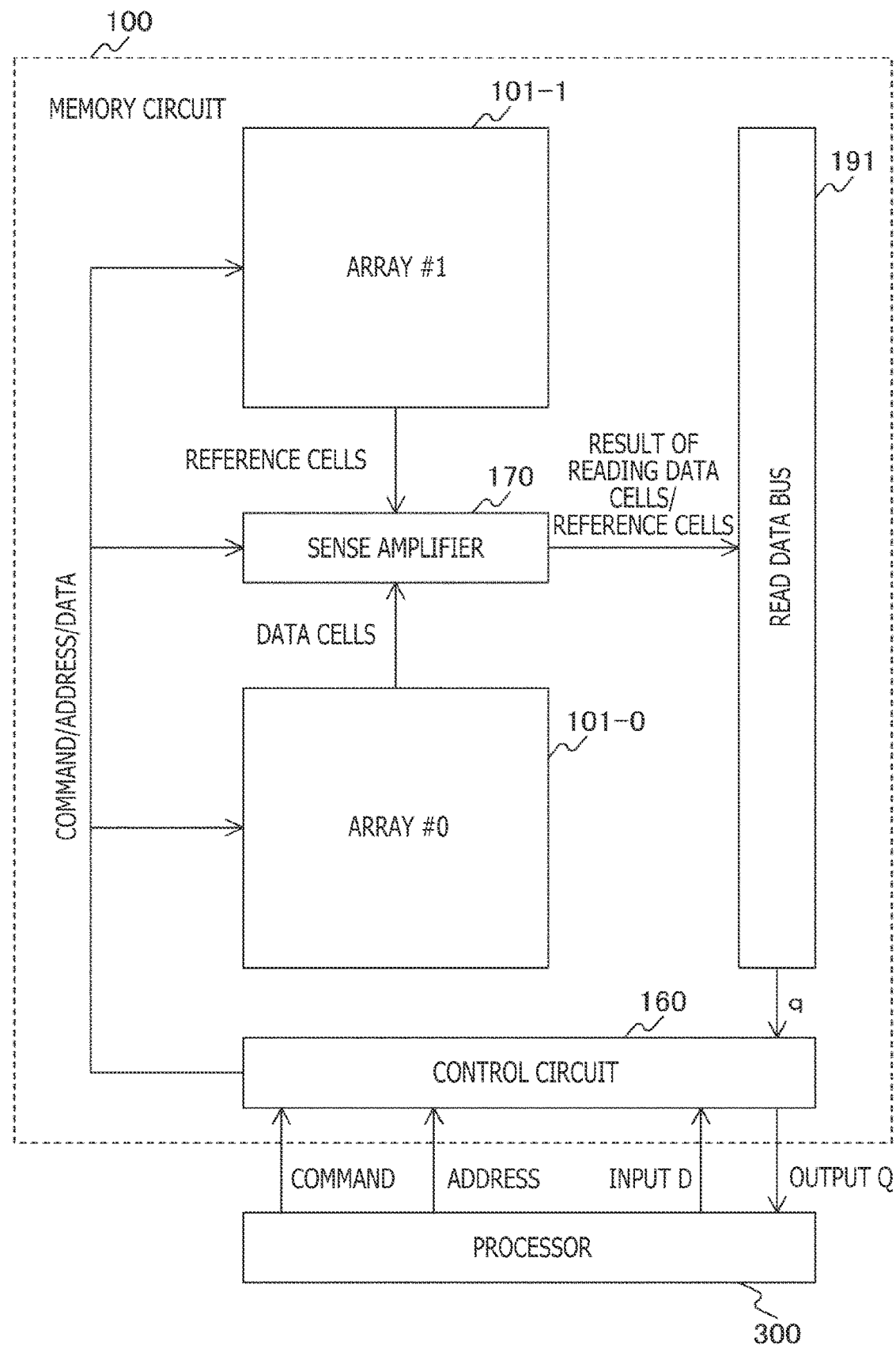
FIG. 14 is a view depicting a configuration example of a memory circuit 100 as a second embodiment of the present technology.

FIG. 14 is a view depicting a configuration example of a memory circuit 100 as a second embodiment of the present technology.

As with the memory circuit of the above-described first embodiment, the memory circuit 100 of the second embodiment includes two arrays 101-0 and 101-1 that share a sense amplifier 170. As in the above-described first embodiment, each of the arrays 101-0 and 101-1 includes a memory cell array 110, a row decoder 120, a word line driver 130, a write-read power supply circuit 140, and a column selection circuit 150.

A control circuit 160 is provided as an interface with a processor 300. The control circuit 160 receives commands, addresses, and write data from the processor 300. Further, a read data bus 191 is connected with the control circuit 160. The control circuit 160 outputs read data to the processor 300 via an output data Q terminal.

In a case where a read command is issued, the sense amplifier 170 receives from the arrays 101-0 and 101-1 signals indicating the values of data memory cells and reference cells, and outputs a logical value resulting from the read operation, onto the read data bus 191. The data is again output to the processor 300 by way of the control circuit 160.

[Operation]

Figure 15:
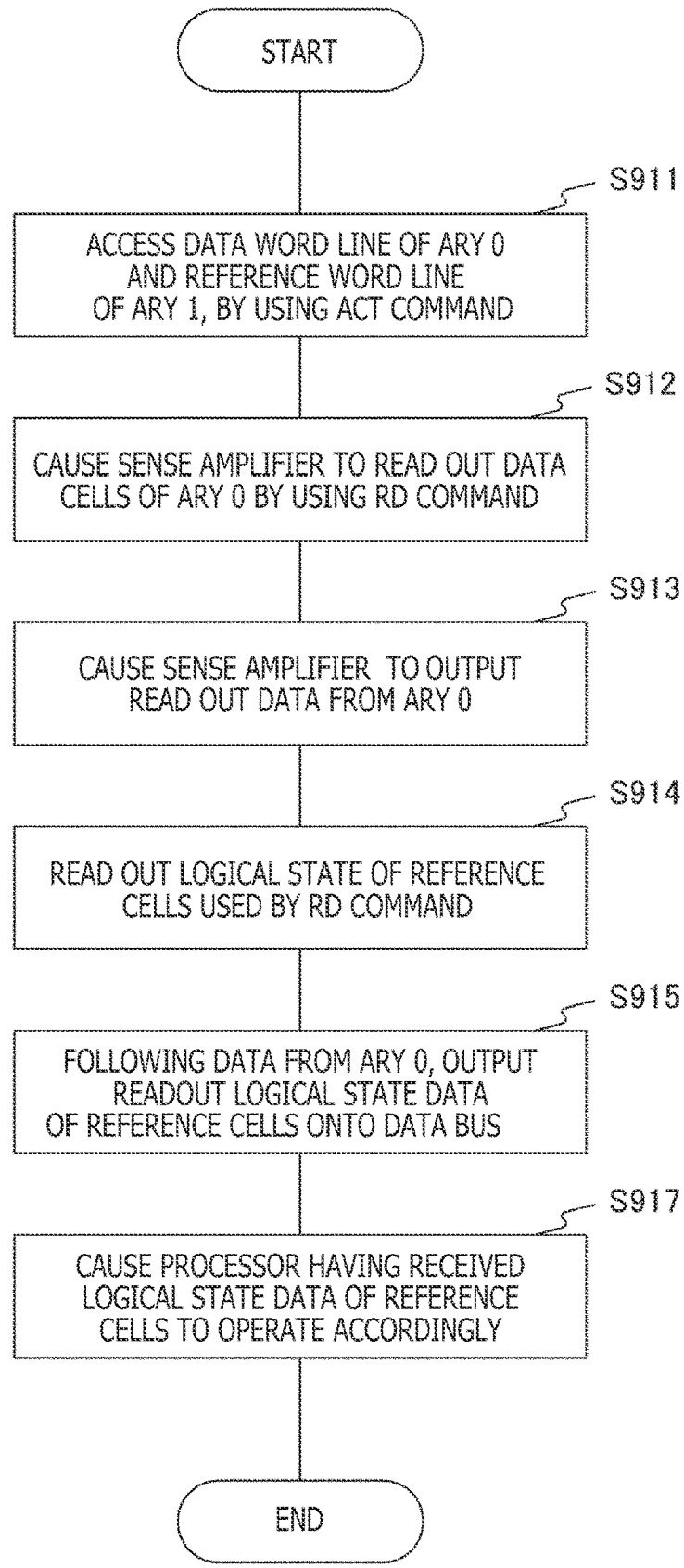
FIG. 15 is a flowchart depicting a typical procedure of steps performed by the memory circuit 100 as the second embodiment of the present technology.

FIG. 15 is a flowchart depicting a typical procedure of steps performed by the memory circuit 100 as the second embodiment of the present technology.

First, an ACT (Active) command for activating the memory is used to access the word line corresponding to the data cells reflecting a given address and the word line corresponding to the reference cells (step S911). In this example, it is assumed that the data cells are read out from the array 101-0 and the reference cells are read out from the array 101-1.

Thereafter, a read command causes the column selection circuit 150 to select the column corresponding to the address as in the above-described case 3, for example, allowing the values of the data cells and reference cells to be read out (step S912). The values of the data cells and reference cells are input to the sense amplifier 170 which in turn outputs amplified data (step S913).

Next, as in the above-described case 1, for example, the logical state of the reference cells used for reading the data cells is read out (step S914). The readout data is output onto the read data bus 191 (step S915).

Figure 16:
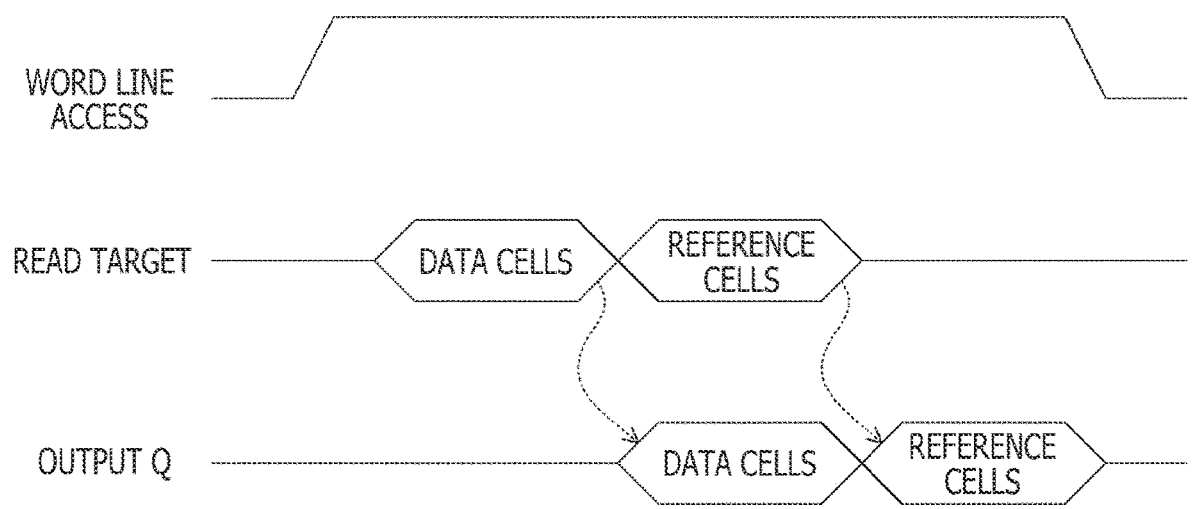
FIG. 16 is a flowchart depicting a typical operation timing of the memory circuit 100 as the second embodiment of the present technology.

In this example, following the data output in step S913, the logical state of the reference cells is output in step S915. That is, as depicted in FIG. 16, the values of the data cells and reference cells targeted for reading are output sequentially from the output data Q terminal. However, as illustrated in FIG. 16, the data from the data cells and the data from the reference cells may be read out by a single word line access operation. An attempt to perform a similar operation with the common open-type configuration may require multiple word line access operations. In this configuration, by contrast, one word line access operation can read both types of data, which improves performance.

Upon receipt of the logical state data of the reference cells, the processor 300 performs an operation based on the received value (step S917). For example, in a case where the received value is different from the expected value, the processor 300 is assumed to issue a refresh command regarding the reference cells and again issue a read command to read the data cells. That is, a re-read operation is performed anew following a rewrite operation of the reference cells so as to prevent incorrect data from being used in subsequent operations and thereby improve the reliability of the system. Incidentally, the read command in this case need not be issued explicitly following the ACT command. Conversely, the read command for the reference cells may be issued explicitly.

According to the second embodiment of the present technology described above, the memory cell values are read out selectively as desired by the column selection circuit 150 from the arrays 101-0 and 101-1, and the values of the data cells and reference cells are output sequentially.

3. Third Embodiment

[Memory Circuit]

Figure 17:
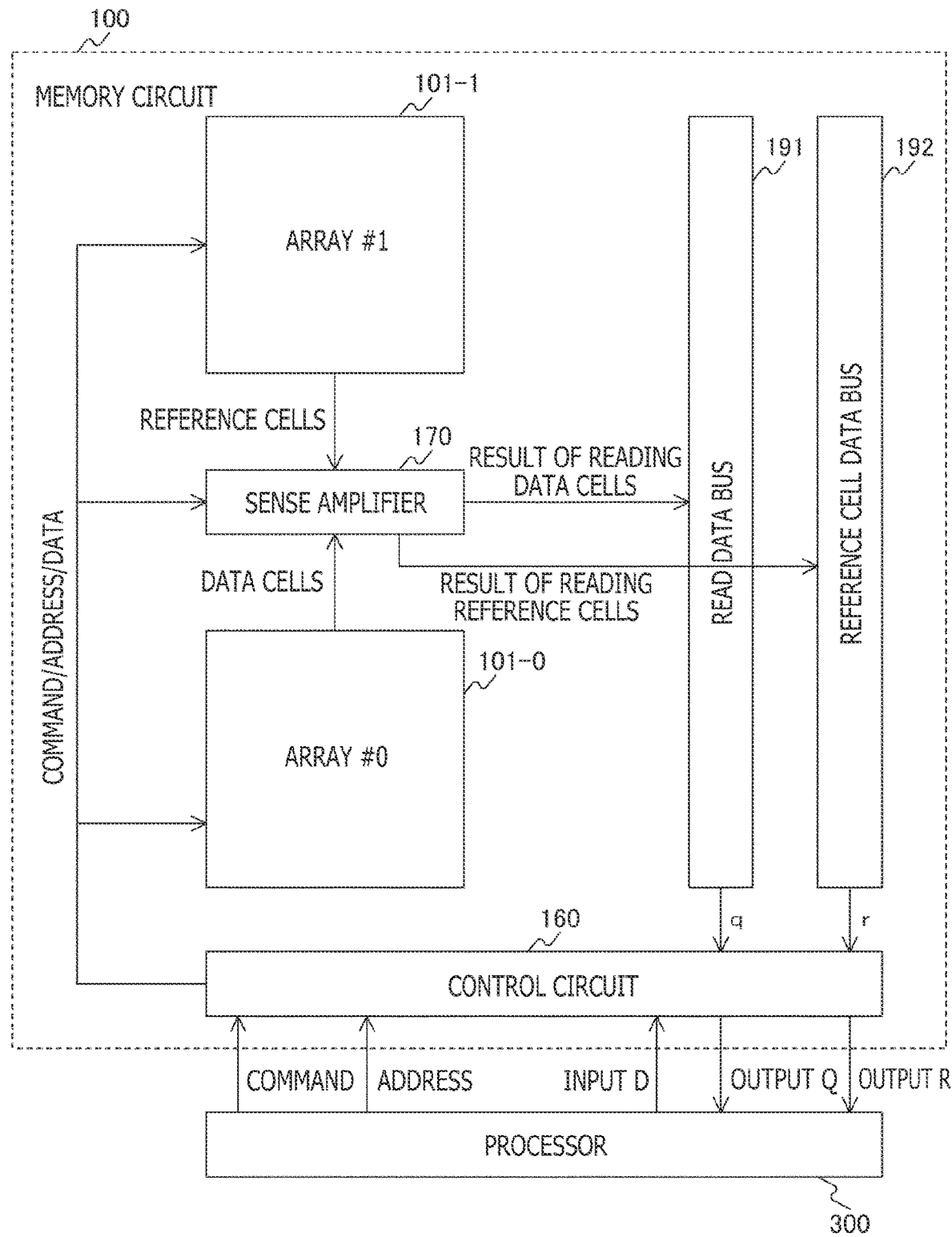
FIG. 17 is a view depicting a configuration example of a memory circuit 100 as a third embodiment of the present technology.

FIG. 17 is a view depicting a configuration example of a memory circuit 100 as a third embodiment of the present technology.

The third embodiment includes a reference cell data bus 192 in addition to what is included in the above-described second embodiment. The sense amplifier 170 outputs the result of a data cell reading operation onto the read data bus 191 and, at the same time, outputs the result of a reference cell reading operation onto the reference cell data bus 192.

[Operation]

Figure 18:
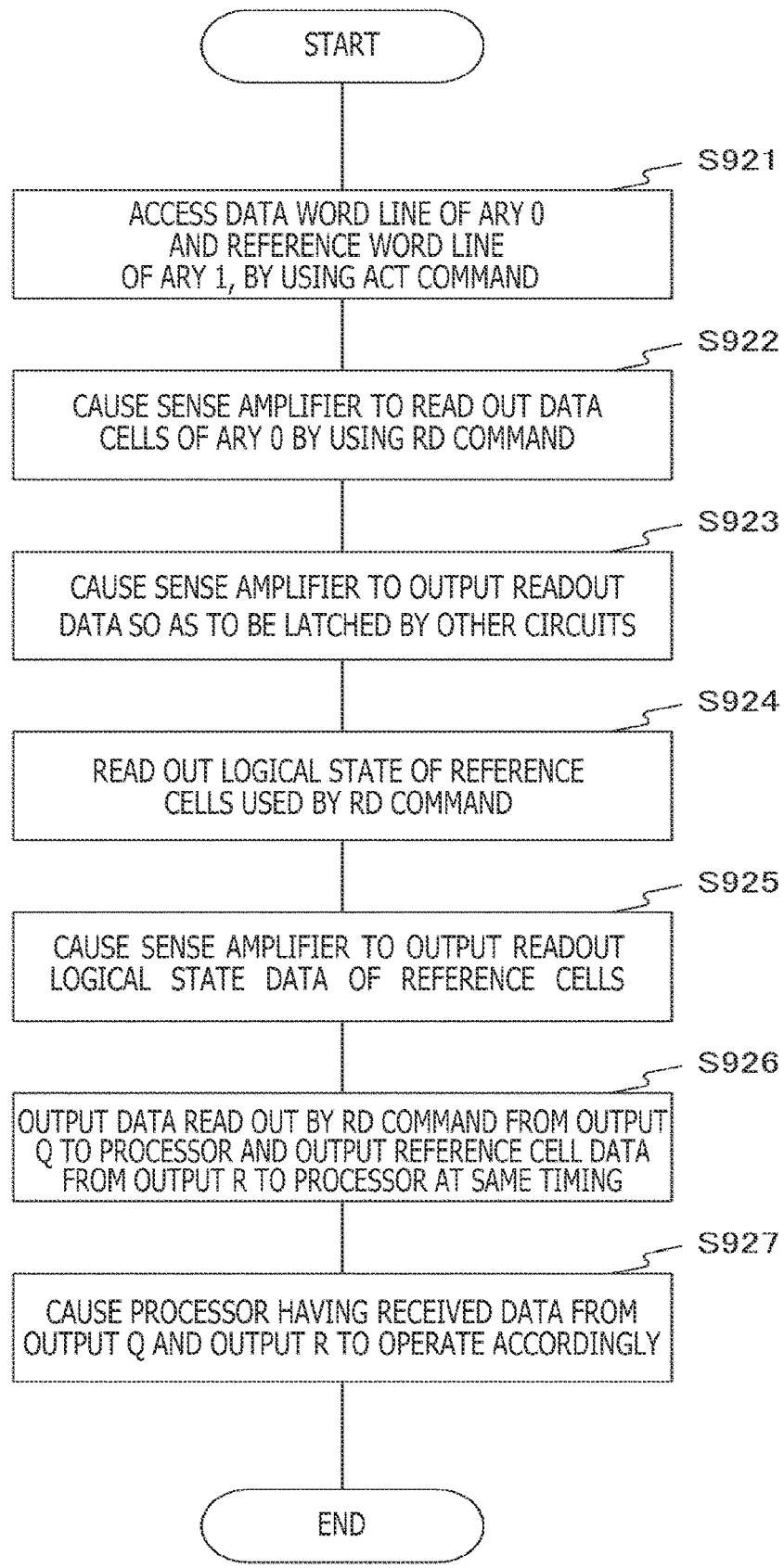
FIG. 18 is a flowchart depicting a typical procedure of steps performed by the memory circuit 100 as the third embodiment of the present technology.

FIG. 18 is a flowchart depicting a typical procedure of steps performed by the memory circuit 100 as the third embodiment of the present technology.

First, an ACT command is used to access the word line corresponding to the data cells reflecting a given address and the word line corresponding to the reference cells (step S921). In this example, it is assumed that the data cells are read out from the array 101-0 and the reference cells are read out from the array 101-1.

Thereafter, a read command causes the column selection circuit 150 to select the column corresponding to the address as in the above-described case 3, for example, allowing the values of the data cells and reference cells to be read out (step S922). The values of the data cells and reference cells are input to the sense amplifier 170 which in turn outputs amplified data to be retained by other circuits such as data latches (step S923).

Next, as in the above-described case 1, for example, the logical state of the reference cells used for reading the data cells is read out (step S924). The readout data is input to the sense amplifier 170 which in turn outputs amplified data (step S925).

Figure 19:
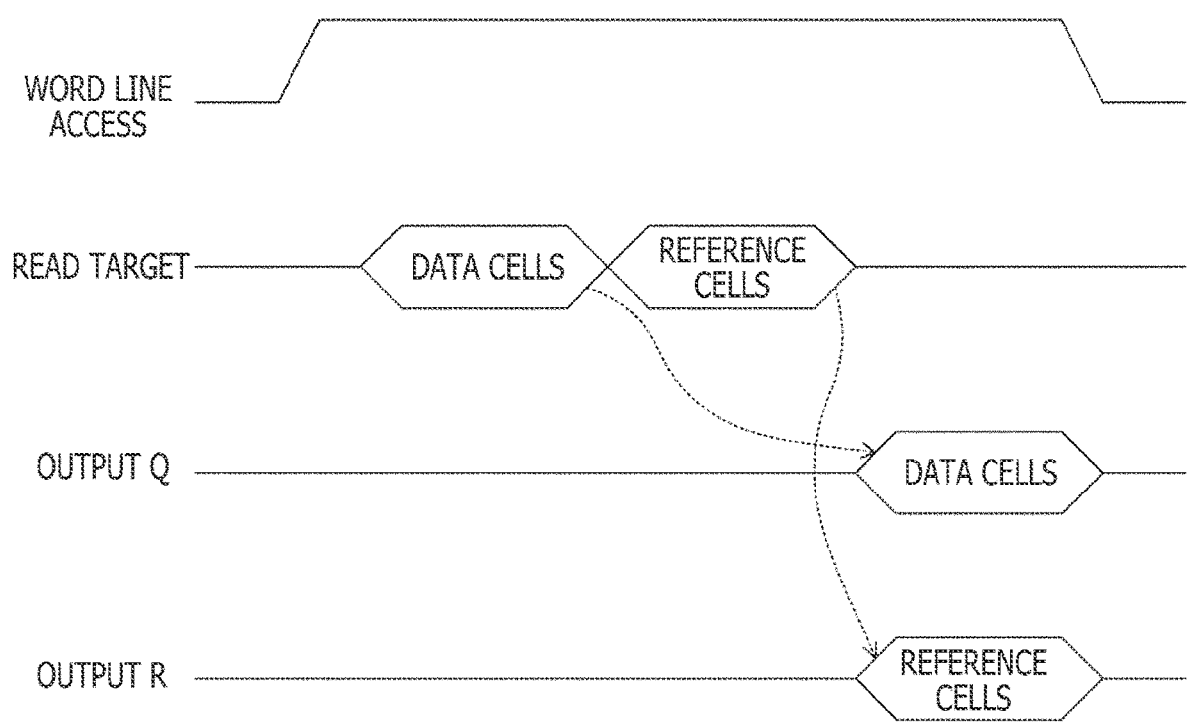
FIG. 19 is a flowchart depicting a typical operation timing of the memory circuit 100 as the third embodiment of the present technology.

Then, the data cell values output in step S923 are output from the output data Q terminal to the processor 300 via the read data bus 191 and the reference cell value output in step S925 is output from an output data R terminal to the processor 300 via the reference cell data bus 192 at the same timing (step S926). That is, as depicted in FIG. 19, the values of the data cells and reference cells targeted for reading are output simultaneously from the output data Q terminal and from the output data R terminal.

Upon receipt of the values of the data cells and reference cells, the processor 300 performs an operation based on the received values (step S927). The details of the operation by the processor 300 are similar to those in the case of the above-described second embodiment.

According to the third embodiment of the present technology, as described above, the memory cell values are read out selectively as desired by the column selection circuit 150 from the arrays 101-0 and 101-1, and the values of the data cells and reference cells are output simultaneously.

4. Fourth Embodiment

[Memory Circuit]

Figure 20:
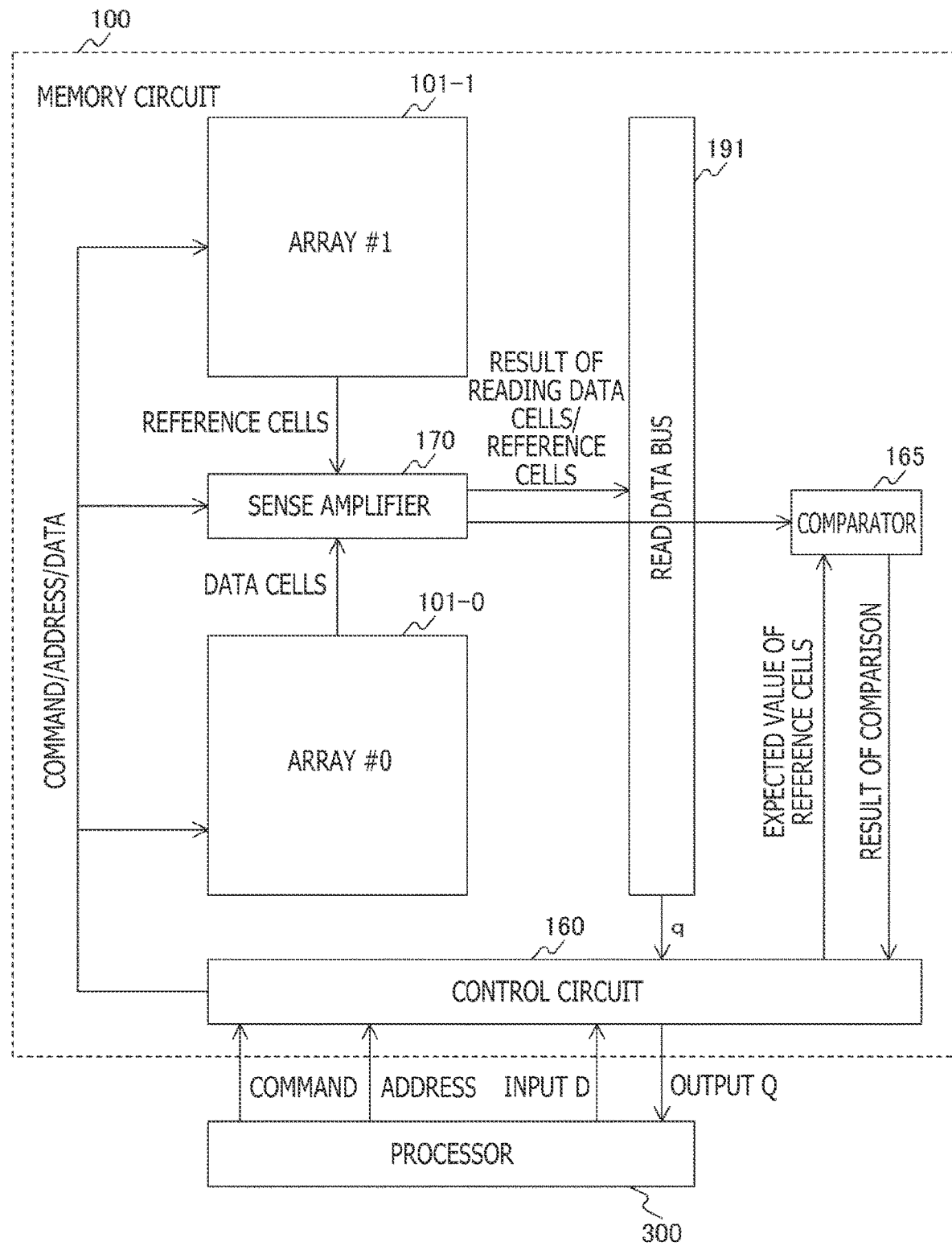
FIG. 20 is a view depicting a configuration example of a memory circuit 100 as a fourth embodiment of the present technology.

FIG. 20 is a view depicting a configuration example of a memory circuit 100 as a fourth embodiment of the present technology.

The memory circuit 100 of the fourth embodiment includes a comparator 165 in addition to what is included in the above-described second embodiment. The comparator 165 compares the reference cell value output from the sense amplifier 170 with the expected value received from the control circuit 160, and outputs the result of the comparison to the control circuit 160.

Upon receipt of the comparison result, the control circuit 160 may perform a refresh operation in a case where the result is different from the expected value. Alternatively, given the comparison result from the control circuit 160, the processor 300 may issue a refresh command. The refresh operation causes a re-read operation to be performed anew following a rewrite operation on the reference cells, so as to prevent incorrect data from being used in subsequent operations and thereby improve the reliability of the system.

According to the fourth embodiment of the present technology, as described above, the refresh operation is carried out on the basis of the result of the comparison by the comparator 165 inside the memory circuit 100.

In the above-described embodiments, the reference cells used for reading out data cells are tested following the readout operation. Alternatively, the reference cells may be tested prior to data cell readout.

Further, with the above-described embodiments, it is assumed that both the data word line and the reference word line are accessed simultaneously when the ACT command is issued. However, the simultaneous access is not mandatory. That is, a reference cell readout command may be provided in such a manner that only the reference word line is accessed when this reference cell readout command is issued, allowing solely the logical state of desired reference cells to be read out and output. It is also possible to access the arrays 101-0 and 101-1 as well as the reference word line and, after reference cell readout from the array 101-0, for example, to read out sequentially the reference cells in the array 101-1. These operations increase the number of reference cells that can be read out by a single column cycle operation, thereby reducing the time required to test the reference cells of the entire memory circuit.

5. Usage Examples

Figure 21:
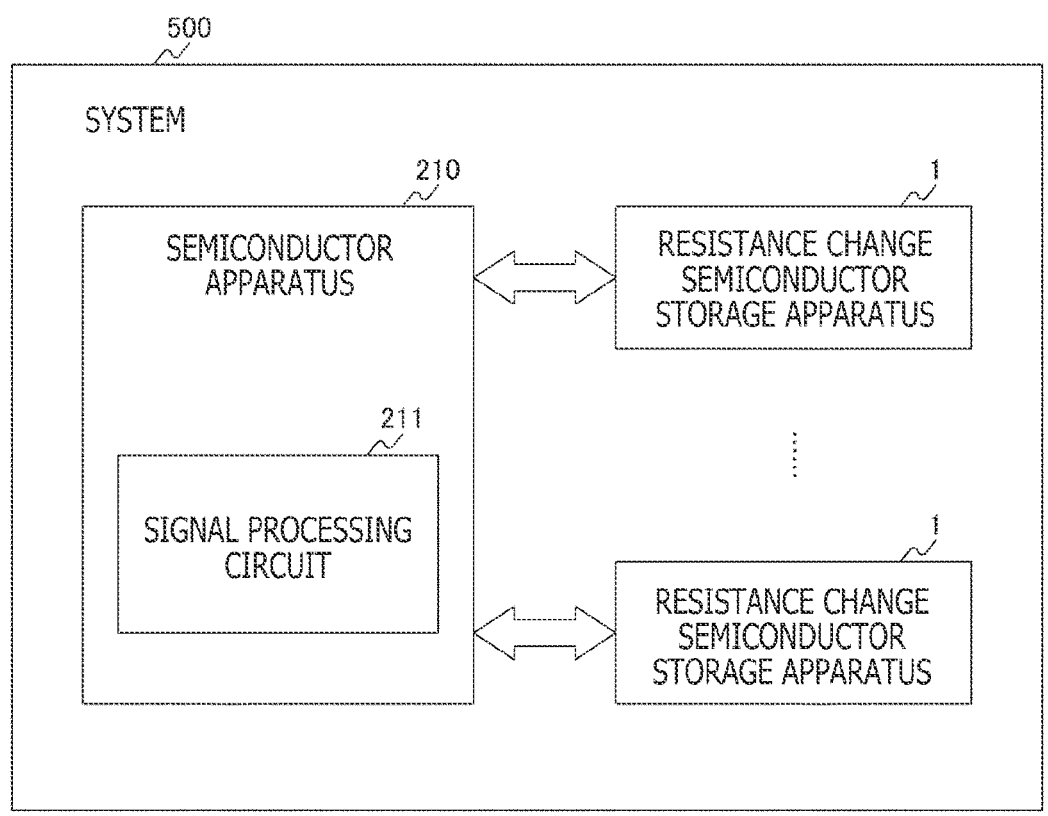
FIG. 21 is a view depicting a first configuration example of a system 500 as a usage example of the memory circuit 100 embodying the present technology.
Figure 22:
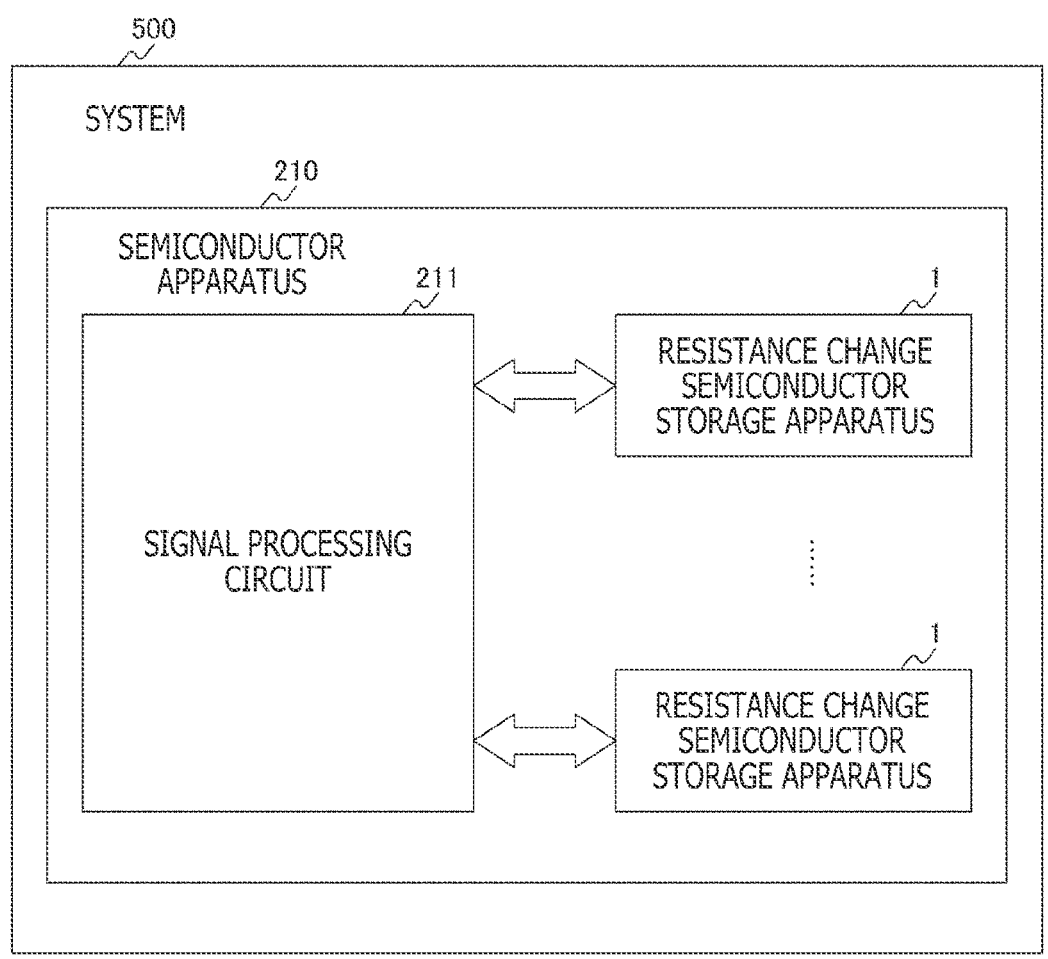
FIG. 22 is a view depicting a second configuration example of a system 500 as another usage example of the memory circuit 100 embodying the present technology.

FIGS. 21 and 22 are views depicting usage examples of the memory circuit 100 embodying the present technology.

One or more of semiconductor storage apparatuses 1 each including the memory circuit 100 embodying the present disclosure may be incorporated in a semiconductor apparatus that is the same as the control circuit for controlling the semiconductor storage apparatuses 1. Alternatively, the semiconductor storage apparatuses 1 may be incorporated in a semiconductor apparatus different from the control circuit for controlling the semiconductor storage apparatuses 1.

FIG. 21 depicts an example of a system 500 in which the semiconductor storage apparatuses 1 are connected with a semiconductor apparatus 210 that includes a signal processing circuit 211. The signal processing circuit 211 is a circuit that generates signals for writing and reading data to and from the semiconductor storage apparatuses 1.

FIG. 22 depicts an example of the system 500 in which semiconductor storage apparatuses 1 are incorporated inside the semiconductor apparatus 210 that includes the signal processing circuit 211.

Figure 23:
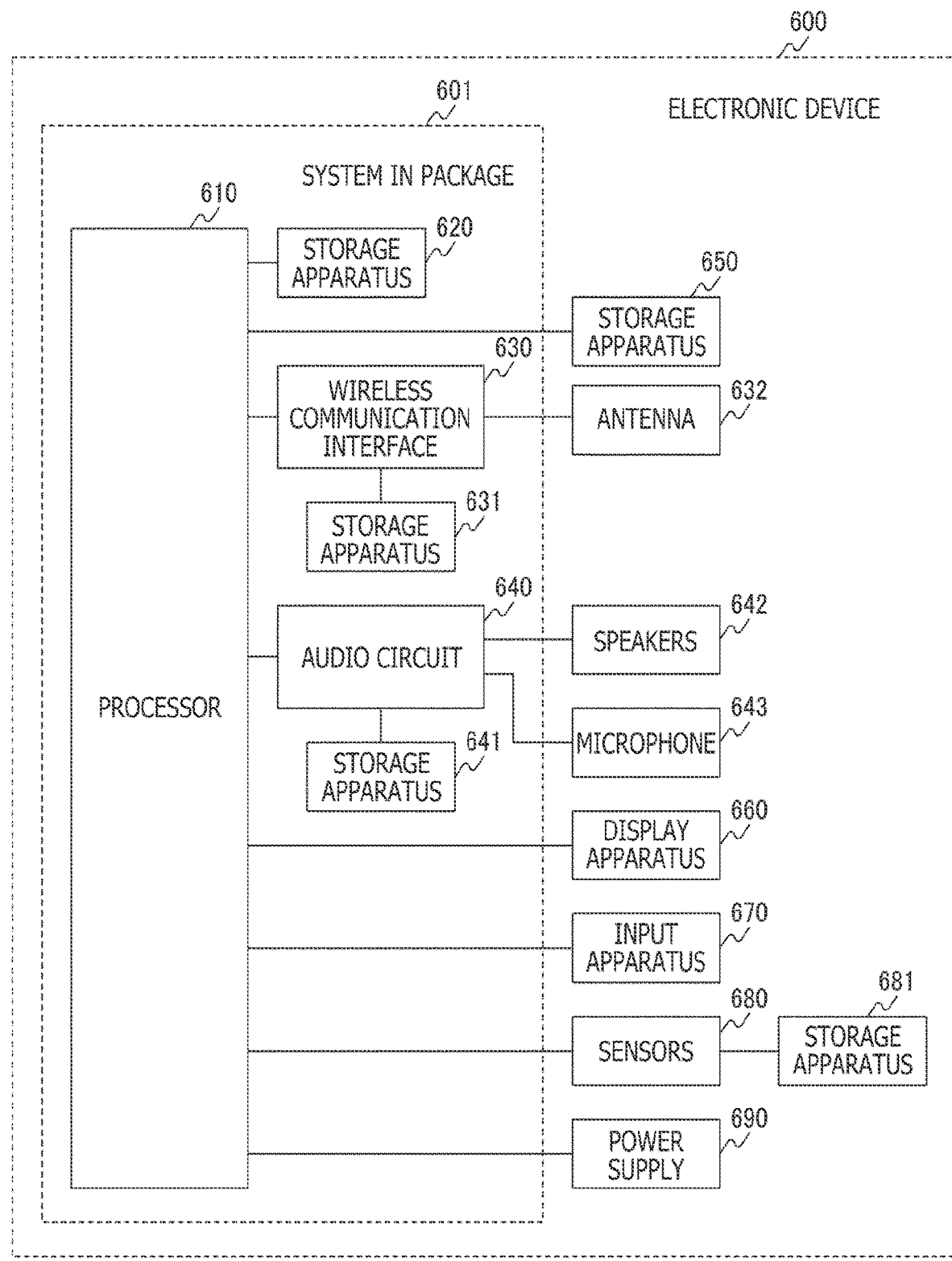
FIG. 23 is a view depicting a configuration example of an electronic device 600 that uses the memory circuit 100 embodying the present technology.

FIG. 23 is a view depicting a configuration example of an electronic device 600 that uses the memory circuit 100 embodying the present technology.

The electronic device 600 may presumably be a smartphone, a digital camera, a digital video camera, a music player, a set-top box, a computer, a television receiver, a watch, active speakers, a headset, a game console, a radio, a measuring instrument, an electronic tag, or a beacon. The electronic device 600 includes a power supply 690, for example, as well as such interfaces as an input apparatus 670 and a display apparatus 660.

A resistance change semiconductor storage apparatus may be connected as a storage apparatus 620 or 650 connected with a processor 610 incorporated in a system-in-package 601 (or system-on-chip).

A wireless communication interface 630 may have the function of mobile communication, Wi-Fi (registered trademark), or short-range communication and may be connected with an antenna 632 and a resistance change storage apparatus 631.

An audio circuit 640 may have the function of controlling speakers 642 and a microphone 643 and may be connected with a resistance change storage apparatus 641.

Sensors 680 may have the function of an optical sensor, a position sensor, an acceleration sensor, a biosensor, a magnetic sensor, a mechanical quantity sensor, a thermal sensor, an electric sensor, or a chemical sensor, and may be connected with a resistance change storage apparatus 681.

The embodiments described above are merely examples in which the present technology may be implemented. The particulars of the embodiments correspond to the inventive matters claimed in the appended claims. Likewise, the inventive matters named in the appended claims correspond to the particulars of the embodiments with the same names in the foregoing description of the preferred embodiments of the present technology. However, these embodiments and other examples are not limitative of the present technology that may also be implemented using various modifications and alterations of the embodiments so far as they are within the scope of the appended claims.

Also, the procedures discussed above in connection with the embodiments may be construed as constituting a method having a series of such procedures. Further, the procedures may be construed as forming a program for causing a computer to execute a series of such procedures, or as constituting a recording medium storing such a program. The recording medium may be a CD (Compact Disc), an MD (MiniDisc), a DVD (Digital Versatile Disc), a memory card, or a Blu-ray Disc (registered trademark), for example.

The advantageous effects stated in this description are only examples and not limitative of the present technology that may also provide other advantages.

The present technology may also be implemented preferably in the following configurations:

(1) A memory circuit including:
multiple memory arrays;
a selection circuit configured to select values output from memory cells in any of the multiple memory arrays, so as to supply a first value and a second value; and
a sense amplifier that has a first input terminal and a second input terminal and that is configured to amplify and output the first value supplied to the first input terminal in reference to the second value supplied to the second input terminal.

(2) The memory circuit as stated in paragraph (1) above, in which
the selection circuit includes
multiple output switches provided corresponding to each of the memory cells, the output switches being configured to control whether or not to output the value from each corresponding memory cell, and
a first input selector and a second input selector provided corresponding to the first input terminal and the second input terminal of the sense amplifier, respectively, the first input selector and the second input selector being configured to select output from the output switches and supply the selected output to the corresponding first and second input terminals.

(3) The memory circuit as stated in paragraph (2) above, in which each of the first and second input selectors is provided with multiple input switches connected to the output of one or more mutually different output switches among the multiple output switches, each of the first and the second input selectors being configured to let any one of the multiple input switches conduct to supply the output therefrom to the corresponding first and second input terminals.

(4) The memory circuit as stated in paragraph (3) above, in which at least one of the multiple input switches receives, in a short-circuited state, the output of the multiple output switches connected to each of the input switches.

(5) The memory circuit as stated in paragraph (4) above, in which the number of the multiple output switches connected to each of the multiple input switches is the same.

(6) The memory circuit as stated in paragraph (4) above, in which the number of the multiple output switches connected to each of the multiple input switches is at least partially different.

(7) The memory circuit as stated in any one of paragraphs (1) to (6) above, further including:
a plurality of the sense amplifiers sharing the second input terminal.

(8) The memory circuit as stated in any one of paragraphs (1) to (7) above, in which the memory cell includes a resistance change memory.

(9) The memory circuit as stated in any one of paragraphs (1) to (8) above, in which the memory cell includes a magnetic resistance change memory.

(10) The memory circuit as stated in any one of paragraphs (1) to (9) above, in which
the sense amplifier performs
a process of outputting data reflecting a magnitude relation between a first potential and a second potential supplied respectively to the first input terminal and the second input terminal, and
a process of outputting data reflecting a magnitude relation between a third potential and a fourth potential supplied respectively to the first input terminal and the second input terminal, the third potential being used to generate the second potential, the fourth potential being different from the second potential.

(11) The memory circuit as stated in paragraph (10) above, in which
the second potential is a reference potential for reading out the first potential, and
the fourth potential is a reference potential for testing the third potential.

(12) The memory circuit as stated in paragraph (10) or (11) above, in which
the first potential and the second potential are read out from mutually different memory arrays among the multiple memory arrays, and
the third potential and the fourth potential are read out from the same memory array.

(13) The memory circuit as stated in any one of paragraphs (10) to (12) above, in which the sense amplifier outputs the data in a case where the first potential and the second potential are supplied respectively to the first input terminal and the second input terminal and outputs the data in a case where the third potential and the fourth potential are supplied respectively to the first input terminal and the second input terminal, at different timings.

(14) The memory circuit as stated in any one of paragraphs (10) to (13) above, in which the sense amplifier outputs the data in a case where the first potential and the second potential are supplied respectively to the first input terminal and the second input terminal and outputs the data in a case where the third potential and the fourth potential are supplied respectively to the first input terminal and the second input terminal, at the same timing.

(15) The memory circuit as stated in any one of paragraphs (10) to (14) above, further including:
a comparator configured to compare the output in a case where the third potential and the fourth potential are supplied respectively to the first input terminal and the second input terminal, with a value expected of the output.

REFERENCE SIGNS LIST

100 Memory circuit
101-0, 101-1 Array
104 Input data D terminal
109 Output data Q terminal
110 Memory cell array
111 Memory cell
112 Resistance change element
113 Switch
117 Word line
118 Source line
119 Bit line
120 Row decoder
130 Word line driver
140 Write-read power supply circuit
141 Current source
142 Switch
150 Column selection circuit
151, 154 Column switch
157 Sense selection circuit
160 Control circuit
165 Comparator
170 Sense amplifier
180 Address decoder
190 Data bus
191 Read data bus
192 Reference cell data bus
300 Processor

The invention claimed is:
1. A memory circuit, comprising:
a plurality of memory arrays;
a selection circuit configured to:
select a first set of output values of a plurality of output values outputted from a plurality of memory cells in the plurality of memory arrays; and
supply a first value and a second value based on the selected set of output values; and
a sense amplifier that comprises a first input terminal and a second input terminal,
wherein
the selection circuit comprises:
a plurality of output switches,
wherein
each output switch of the plurality of output switches corresponds to an output value of each memory cell of the plurality of memory cells, and
each output switch of the plurality of output switches is configured to control whether to output the output value from each corresponding memory cell of the plurality of memory cells, and
a first input selector configured to:
select a first output value, from the selected first set of output values, as the first value, and
supply the first value to the first input terminal of the sense amplifier; and
a second input selector configured to:
select a second output value, from the selected first set of output values, as the second value, and
supply the second value to the second input terminal of the sense amplifier,
wherein
the second value is different from the first value, and
the second input terminal is different from the first input terminal,
wherein the sense amplifier is configured to:
amplify the first value supplied to the first input terminal based on the second value supplied to the second input terminal; and
output the amplified first value.

2. The memory circuit according to claim 1, wherein
both the first input selector and the second input selector comprises a plurality of input switches connected to an output of at least one mutually different output switches of the plurality of output switches, and
each of the first input selector and the second input selector is configured to let one input switch of the plurality of input switches conduct to supply the output, of the at least one mutually different output switches, to the one of the first input terminal or the second input terminal.

3. The memory circuit according to claim 2, wherein
at least one input switch of the plurality of input switches receives, in a short-circuited state, the output of the at least one mutually different output switches of the plurality of output switches, and
the at least one mutually different output switches is connected to each input switch of the plurality of input switches.

4. The memory circuit according to claim 3, wherein a number of the plurality of output switches connected to each input switch of the plurality of input switches is same.

5. The memory circuit according to claim 3, wherein the number of the plurality of output switches connected to each of the plurality of input switches is partially different.

6. The memory circuit according to claim 1, further comprising a plurality of sense amplifiers sharing the second input terminal.

7. The memory circuit according to claim 1, wherein each memory cell of the plurality of memory cells includes a resistance change memory.

8. The memory circuit according to claim 1, wherein each memory cell of the plurality of memory cells includes a magnetic resistance change memory.

9. The memory circuit according to claim 1, wherein the sense amplifier is further configured to:
output first data reflecting a magnitude relation between a first potential and a second potential,
wherein
the first potential is supplied to the first input terminal, and
the second potential is supplied to the second input terminal; and output second data reflecting a magnitude relation between a third potential and a fourth potential,
wherein
the third potential and the fourth potential are supplied, respectively, to the first input terminal and the second input terminal,
the third potential is used to generate the second potential, and
the fourth potential is different from the second potential.

10. The memory circuit according to claim 9, wherein
the second potential is a first reference potential to read out the first potential, and
the fourth potential is a second reference potential to test the third potential.

11. The memory circuit according to claim 9, wherein
the first potential and the second potential are read out from mutually different memory arrays of the plurality of memory arrays, and
the third potential and the fourth potential are read out from a same memory array.

12. The memory circuit according to claim 9, wherein the sense amplifier is further configured to outputs the first data and the second data at different timings.

13. The memory circuit according to claim 9, wherein the sense amplifier is further configured to output the first data the second data at a same timing.

14. The memory circuit according to claim 9, further comprising a comparator configured to compare a first output in a case where the third potential and the fourth potential are supplied respectively to the first input terminal and the second input terminal, with a specific value.

* * * * *